United States Patent
Nakajima et al.

(10) Patent No.: US 8,115,234 B2
(45) Date of Patent: Feb. 14, 2012

(54) SEMICONDUCTOR DEVICE

(75) Inventors: Akishige Nakajima, Tokyo (JP);
Yasushi Shigeno, Tokyo (JP); Hitoshi Akamine, Tokyo (JP); Tsutomu Kobori, Tokyo (JP); Izumi Arai, Tokyo (JP); Kazuto Tajima, Tokyo (JP); Tomoyuki Ishikawa, Tokyo (JP); Jyun Funaki, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 243 days.

(21) Appl. No.: 12/564,939

(22) Filed: Sep. 23, 2009

(65) Prior Publication Data

US 2010/0096667 A1 Apr. 22, 2010

(30) Foreign Application Priority Data

Oct. 20, 2008 (JP) ................. 2008-269901

(51) Int. Cl.
*H01L 29/778* (2006.01)
*H01L 29/80* (2006.01)

(52) U.S. Cl. ........ 257/194; 257/256; 257/782; 257/724; 257/E29.246; 257/E29.31

(58) Field of Classification Search .................. 257/194, 257/256, E29.246, E29.31, E23.12, 782, 257/724
See application file for complete search history.

(56) References Cited

U.S. PATENT DOCUMENTS

| 2007/0034946 A1* | 2/2007 | Akamine et al. | 257/341 |
| 2009/0008774 A1* | 1/2009 | Akamine et al. | 257/728 |
| 2009/0104881 A1 | 4/2009 | Ogawa et al. | |

FOREIGN PATENT DOCUMENTS

JP 2006-165224 A 6/2006

* cited by examiner

*Primary Examiner* — Cuong Q Nguyen
*Assistant Examiner* — Cathy N Lam
(74) *Attorney, Agent, or Firm* — Mattingly & Malur, PC

(57) ABSTRACT

There is provided a technique for reducing the occurrence of higher harmonics which occur from a field effect transistor, particularly a field effect transistor configuring a switching element of an antenna switch. In a transistor having a meander structure, the gate width of a partial transistor closest to a gate input side is increased. More specifically, a comb-like electrode is made longer than the other comb-like electrodes. In other words, a finger length is made greater than any other finger length. In particular, the comb-like electrode has the greatest length in all the comb-like electrodes.

18 Claims, 12 Drawing Sheets

FIG. 8

Pin=35dBm
Freq=880MHz

| Lw1(μm) | 102.50 | 130.69 | 150.00 | 168.99 | 187.96 |
|---|---|---|---|---|---|
| Lwn(μm) | 102.50 | 101.00 | 100.00 | 99.00 | 98.00 |
| Lw1/Lwn | 1.00 | 1.29 | 1.50 | 1.71 | 1.92 |
| Vrf1(V) | 1.23 | 1.18 | 1.14 | 1.11 | 1.08 |
| Vrfn(V) | 1.08 | 1.04 | 1.00 | 0.98 | 0.95 |
| 3HD(dBc) | 63.19 | 64.29 | 65.22 | 66.10 | 66.99 |

GATE WIDTH Wg=2050μm
NUMBER OF FINGERS=20

SEMICONDUCTOR DEVICE

CROSS-REFERENCE TO RELATED APPLICATIONS

The disclosure of Japanese Patent Application No. 2008-269901 filed on Oct. 20, 2008 including the specification, drawings and abstract is incorporated herein by reference in its entirety.

BACKGROUND OF THE INVENTION

The present invention relates to a semiconductor device, and in particular, relates to a technique effective in application to a semiconductor device including an antenna switch.

Japanese Unexamined Patent Publication No. 2006-165224 describes a technique for providing a field effect transistor capable of potential stabilization between multi-gates without increasing insertion loss. More specifically, the field effect transistor has two ohmic electrodes formed over a semiconductor substrate, at least two gate electrodes disposed between the two ohmic electrodes, and a conductive region interposed between adjacent gate electrodes. The conductive region has a wide region, at one end thereof, which is wider than the conductive region interposed between the adjacent gate electrodes, so that the distance between the adjacent gate electrodes is smaller than the width of the wide region. Further, a resistance is coupled in series between the two ohmic electrodes through the wide region.

SUMMARY OF THE INVENTION

Recent cellular phones have various application functions as well as the verbal communication function. That is, functions besides the verbal communication function, such as listening to distribution music through the use of a cellular phone, moving image transmission, and data transfer are added to the cellular phone. With the cellular phone made multifunctional, there exist a number of frequency bands such as a GSM (Global System for Mobile communications) band and a PCS (Personal Communication Services) band and modulation schemes such as GSM, EDGE (Enhanced Data rates for GSM Evolution), and WCDMA (Wideband Code Division Multiplex Access) in the world. Accordingly, the cellular phone needs to support transmission/reception signals complying with a plurality of different frequency bands and different modulation schemes. For this reason, in the cellular phone, one antenna is shared between the transmission and reception of these transmission/reception signals, and coupling to the antenna is switched by an antenna switch.

In the cellular phone, a transmission signal usually has a high power exceeding 1 W. The antenna switch is required to have the performance of ensuring the high quality of the high-power transmission signal and reducing the occurrence of interfering waves (higher harmonics) which interfere with communication in other frequency bands. For this reason, in the case where a field effect transistor is used as a switching element configuring the antenna switch, the field effect transistor is required to have the performance of reducing harmonic distortion as well as withstanding high voltages.

Improvement in electrical characteristics such as reduction in harmonic distortion is required for the antenna switch. On the other hand, simplification of control signals for controlling the antenna switch (reduction in the number of control signals, lower voltage of the control signals) and cost reduction of the antenna switch (reduction of a chip size) are required for the antenna switch. Even in this situation, improvement in electrical characteristics such as reduction in harmonic distortion is required for the antenna switch. That is, both electrical characteristic improvement and cost reduction are necessary to manufacture the antenna switch.

It is an object of the present invention to provide a technique for reducing the occurrence of higher harmonics which occur from a field effect transistor, particularly a field effect transistor configuring a switching element of an antenna switch.

The above and other objects and novel features of the present invention will become apparent from the description of this specification and the accompanying drawings.

A typical aspect of the invention disclosed in the present application will be briefly described as follows.

A semiconductor device according to the invention includes a field effect transistor formed over a semiconductor substrate. The field effect transistor has (a) a first ohmic electrode and a second ohmic electrode which extend in a first direction of the semiconductor substrate and are disposed to face each other and (b) a plurality of first comb-like electrodes which project in a second direction intersecting the first direction from a counter surface, facing the second ohmic electrode, of the first ohmic electrode. Further, the field effect transistor has (c) a plurality of second comb-like electrodes which project in the second direction intersecting the first direction from a counter surface, facing the first ohmic electrode, of the second ohmic electrode and (d) a gate electrode which extends along a space formed between the first comb-like electrodes and the second comb-like electrodes by disposing the first comb-like electrodes and the second comb-like electrodes alternately in comb shape. In the semiconductor device, the length of a comb-like electrode closest to an input side where a control signal is inputted to the gate electrode, of comb-like electrodes including the first comb-like electrodes and the second comb-like electrodes is made greater than the lengths of the other comb-like electrodes.

A typical effect of the invention disclosed in the present application will be briefly described as follows.

It is possible to reduce harmonic distortion which occurs from an antenna switch in a semiconductor device including the antenna switch.

BRIEF DESCRIPTION OF THE DRAWINGS

FIG. 8 is a table showing a simulation result achieved in the first embodiment.

DESCRIPTION OF THE PREFERRED EMBODIMENTS

Figure 1:
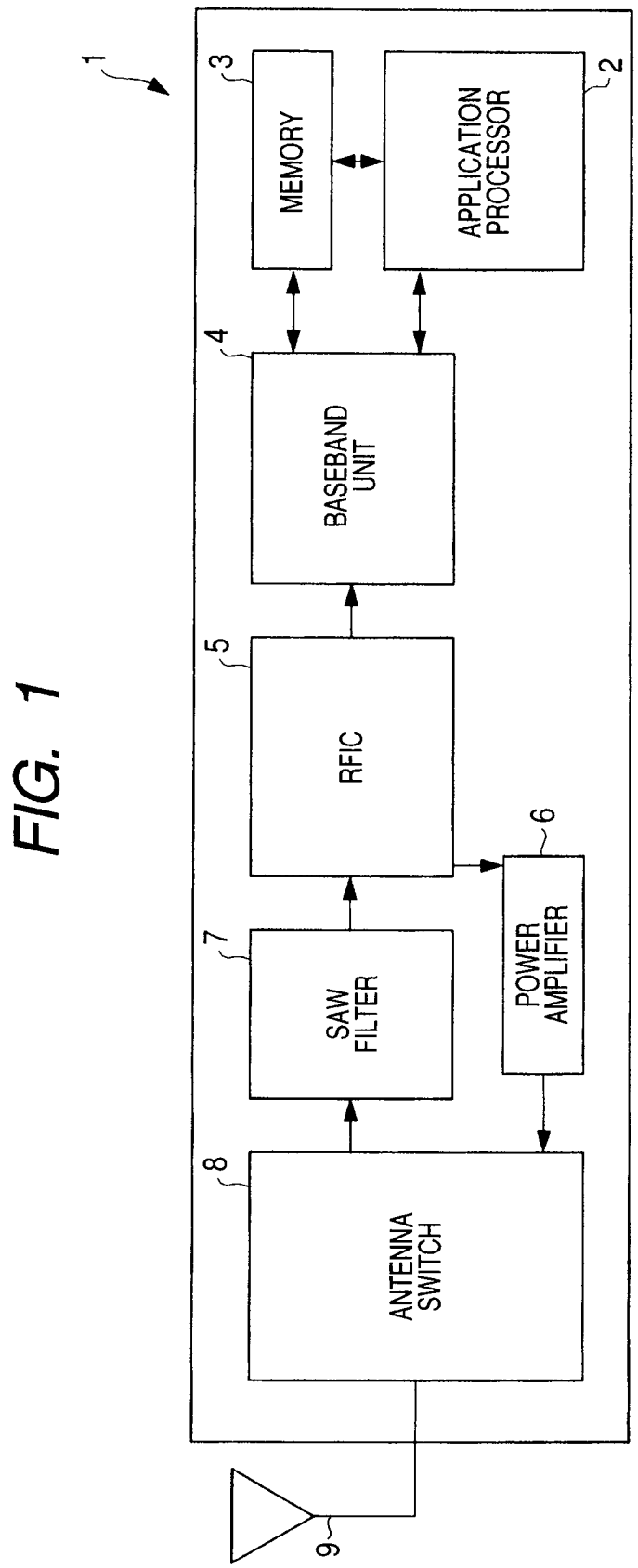
FIG. 1 is a block diagram showing the configuration of a transmission/reception unit of a cellular phone.

In the following embodiments, description will be made by dividing an embodiment into a plurality of sections or embodiments when necessary for the sake of convenience; however, except when a specific indication is given, they are not mutually unrelated, but there is a relationship that one section or embodiment is a modification, specification, or supplementary explanation of part or all of another section or embodiment.

Further, in the case where the following embodiments deal with a numerical expression (including a number, a numerical value, amount, range) concerning elements, the numerical expression is not limited to the specific number but may be larger or smaller than the specific number except when a specific indication is given or when the expression is apparently limited to the specific number in principle.

Furthermore, in the following embodiments, the components (including element steps) are not always indispensable except when a specific indication is given or when they are apparently considered to be indispensable in principle.

Similarly, in the case where the following embodiments deal with the shape, positional relationship, etc., of the components etc., those substantially approximate or similar to them in shape etc. are also included except when a specific indication is given or when they are apparently considered to be excluded in principle. This also applies to numerical values and ranges described above.

In all the drawings for illustrating the embodiments, the same components or members are basically denoted by the same reference numerals, and their description will not be repeated. Further, hatching may be provided even to plan views for the sake of drawing visibility.

First Embodiment

<Configuration and Operation of Cellular Phone>

FIG. 1 is a block diagram showing the configuration of a transmission/reception unit of a cellular phone. As shown in FIG. 1, the cellular phone 1 includes an application processor 2, a memory 3, a baseband unit 4, an RFIC 5, a power amplifier 6, a SAW (Surface Acoustic Wave) filter 7, an antenna switch 8, and an antenna 9.

The application processor 2 is comprised of, e.g., a CPU (Central Processing Unit), and has the function of implementing the application function of the cellular phone 1. More specifically, the application processor 2 reads and interprets an instruction from the memory 3, and performs various kinds of calculation and control based on the interpreted result, thus implementing the application function. The memory 3 has the function of storing data such as a program for operating the application processor 2 and data processed by the application processor 2. Further, the memory 3 can access not only the application processor 2 but also the baseband unit 4, and can be used also for storing data processed by the baseband unit.

The baseband unit 4 includes a CPU which is a central control unit. At the time of transmission, the baseband unit 4 performs digital processing on an audio signal (analog signal) from a user (calling person) through an operating unit to generate a baseband signal. On the other hand, at the time of reception, the baseband unit 4 generates an audio signal from a baseband signal (digital signal).

The RFIC 5 modulates a baseband signal to generate a radio-frequency signal at the time of transmission, and demodulates a reception signal to generate a baseband signal at the time of reception. The power amplifier 6 is a circuit for generating and outputting a high-power signal similar to a weak input signal by power supplied from a power supply. The SAW filter 7 passes only a predetermined frequency band of a reception signal.

The antenna switch 8 separates a reception signal inputted to the cellular phone 1 and a transmission signal outputted from the cellular phone 1 from each other. The antenna 9 transmits and receives radio waves.

The cellular phone 1 is configured as described above, and the operation thereof will be briefly described below. First, signal transmission will be described. A baseband signal generated by performing digital processing on an analog signal such as an audio signal by the baseband unit 4 is inputted to the RFIC 5. In the RFIC 5, the inputted baseband signal is converted into an RF (Radio Frequency) signal by a modulation signal source and a mixer. The converted RF signal is outputted from the RFIC 5 to the power amplifier (RF module) 6. The RF signal inputted to the power amplifier 6 is amplified by the power amplifier 6, and then transmitted from the antenna 9 through the antenna switch 8.

Next, signal reception will be described. An RF signal (reception signal) received by the antenna 9 passes through the SAW filter 7, and is inputted to the RFIC 5. In the RFIC 5, the inputted reception signal is amplified, and then frequency-converted by the modulation signal source and the mixer. Then, detection is performed on the frequency-converted signal, and a baseband signal is extracted. Then, the baseband signal is outputted from the RFIC 5 to the baseband unit 4. The baseband signal is processed by the baseband unit 4, from which an audio signal is outputted.

<Configuration of RF Module>

Figure 2:
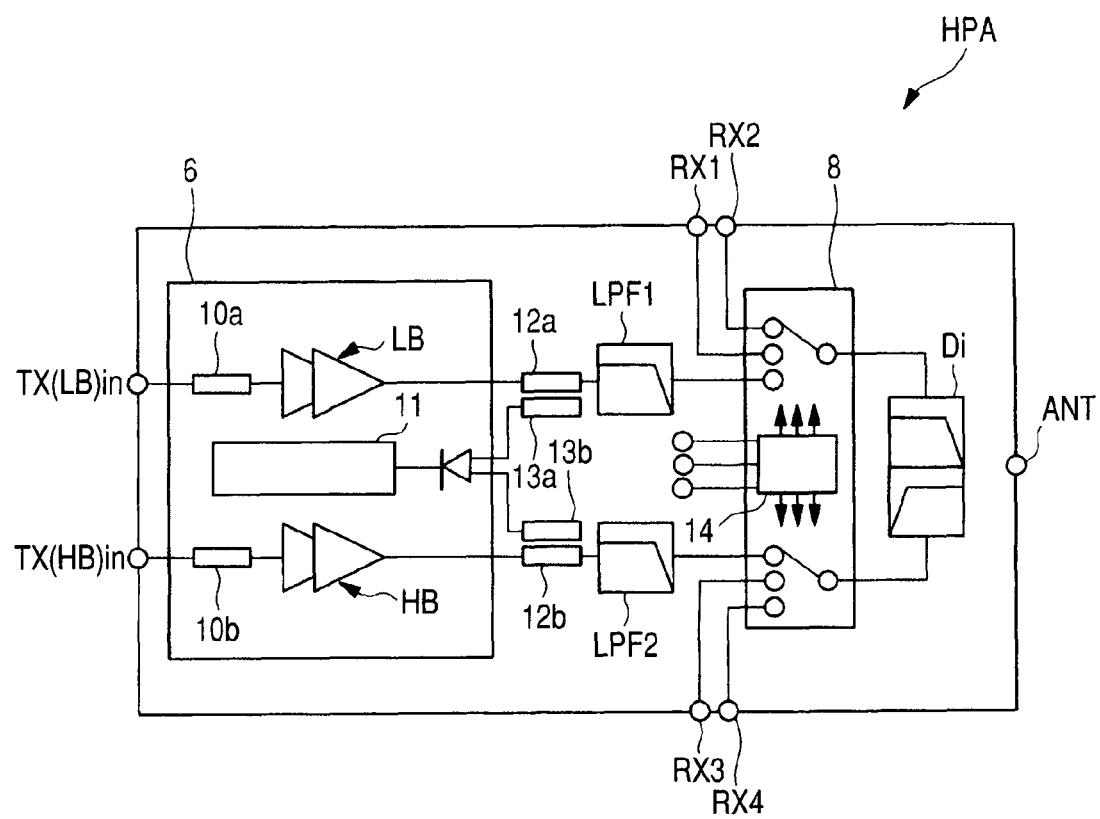
FIG. 2 is a diagram showing the circuit block configuration of an RF module according to a first embodiment.

As described above, when the signal is transmitted from the digital cellular phone, the signal is amplified by the power amplifier 6, and then outputted from the antenna 9 through the antenna switch 8. The power amplifier 6 and the antenna switch 8 are manufactured, for example, in one RF module HPA. Hereinafter, the circuit block configuration of the RF module HPA will be described. FIG. 2 is a diagram showing the circuit block configuration of the RF module HPA according to the first embodiment. In FIG. 2, the RF module HPA according to the first embodiment includes the power amplifier 6, output matching circuits 12a and 12b, detector circuits 13a and 13b, low-pass filters LPF1 and LPF2, the antenna switch 8, and a diplexer D1.

The power amplifier 6 is comprised of matching circuits 10a and 10b, amplifier circuits LB and HB, and a control circuit 11. The matching circuit 10a suppresses the reflection of an input signal (RF input) inputted to an input terminal TX(LB) in of the RF module HPA for efficient output to the amplifier circuit LB. The matching circuit 10a is formed of passive components such as an inductor, a capacitive element, and a resistive element, which are combined to provide impedance matching for the input signal. The input signal inputted to the matching circuit 10a is a signal of a first frequency band. A signal of the first frequency band complies with, e.g., GSM (Global System for Mobile Communication), and lies in the GSM low frequency band (824 to 915 MHz) and the GSM high frequency band (1710 to 1910 MHz).

The amplifier circuit LB is coupled to the matching circuit 10a, and amplifies the input signal outputted from the matching circuit 10a. That is, the amplifier circuit LB is an amplifier for amplifying the input signal of the GSM low frequency band, and is comprised of, e.g., two amplification stages. In the amplifier circuit LB, the input signal of the GSM low frequency band outputted from the matching circuit 10a is amplified by the first amplifier, and the amplified input signal is amplified by the final amplifier. With the amplifier circuit LB, a high-power amplification signal similar to the weak input signal can be obtained.

Thus, the power amplifier 6 includes the matching circuit 10a and the amplifier circuit LB for amplifying the input signal of the GSM low frequency band. Further, the power amplifier 6 can also amplify the input signal of the GSM high frequency band (1710 to 1910 MHz). More specifically, the power amplifier 6 further includes the matching circuit 10b and the amplifier circuit HB.

The matching circuit 10b suppresses the reflection of an input signal (RF input) inputted through an input terminal TX(HB) in of the RF module HPA for efficient output to the amplifier circuit HB. The matching circuit 10b is formed of passive components such as an inductor, a capacitive element, and a resistive element, which are combined to provide impedance matching for the input signal. The input signal inputted to the matching circuit 10b is a signal of a second frequency band. A signal of the second frequency band complies with, e.g., GSM (Global System for Mobile Communication), and lies in the GSM high frequency band (1710 to 1910 MHz). The matching circuit 10b is a matching circuit for the signal of the GSM high frequency band, and is comprised of passive components having different values from those of the matching circuit for the signal of the GSM low frequency band.

The amplifier circuit HB is coupled to the matching circuit 10b, and amplifies the input signal outputted from the matching circuit 10b. That is, the amplifier circuit HB is an amplifier for amplifying the input signal of the GSM high frequency band, and is comprised of, e.g., two amplification stages. In the amplifier circuit HB, the input signal of the GSM high frequency band outputted from the matching circuit 10b is amplified by the first amplifier, and the amplified input signal is amplified by the final amplifier. With the amplifier circuit HB, a high-power amplification signal similar to the weak input signal can be obtained.

As described above, the power amplifier 6 according to the first embodiment can amplify signals of different frequency bands which are the GSM low frequency band and the GSM high frequency band. Further, the power amplifier 6 includes the control circuit 11 for controlling the amplifier circuit LB for amplifying the signal of the GSM low frequency band and the amplifier circuit HB for amplifying the signal of the GSM high frequency band. The control circuit 11 controls amplification degrees by applying respective bias voltages to the amplifier circuit LB and the amplifier circuit HB in accordance with a power supply voltage and a control signal (power control voltage) inputted to the RF module HPA.

Thus, the control circuit 11 controls the amplifier circuit LB and the amplifier circuit HB, that is, performs feedback control so as to maintain the amplification degree of the amplifier circuit LB and the amplification degree of the amplifier circuit HB. The configuration of this feedback control will be described.

To implement the feedback control, a directional coupler (not shown) is provided at the output of the amplifier circuit LB for amplifying the signal of the GSM low frequency band. The directional coupler can detect the power of the amplification signal amplified by the amplifier circuit LB. More specifically, the directional coupler is formed of a main line and a sub line, and detects the power of the amplification signal traveling through the main line by electromagnetic coupling with the sub line.

The detector circuit 13a is coupled to the directional coupler. The detector circuit 13a converts the power detected by the directional coupler into the voltage or current to output the detection signal to the control circuit 11. Thus, the feedback control is implemented by the directional coupler and the detector circuit 13a. The control circuit 11 calculates the difference between the detection signal inputted from the detector circuit 13a and the control signal (power control voltage), and adjusts a bias voltage to be applied to the amplifier circuit LB so as to eliminate the calculated difference. Thus, the control circuit 11 performs control so as to maintain the amplification degree of the amplifier circuit LB. Similarly, a directional coupler (not shown) is provided at the output of the amplifier circuit HB for amplifying the signal of the GSM high frequency band, and the detector circuit 13b is coupled to the directional coupler. A detection signal detected by the detector circuit 13b is inputted to the control circuit 11.

Then, the amplification signal amplified by the amplifier circuit LB included in the power amplifier 6 is inputted to the output matching circuit 12a for providing impedance matching for the amplification signal. That is, the output matching circuit 12a has the function of efficiently transferring the amplification signal amplified by the amplifier circuit LB, and is comprised of passive components such as an inductor, a capacitive element, and a resistive element. The output matching circuit 12a is a matching circuit for the signal of the GSM low frequency band because the amplification signal amplified by the amplifier circuit LB is inputted thereto.

The low-pass filter LPF1 is coupled to the output matching circuit 12a, and has the function of eliminating harmonic noise. For example, when the amplifier circuit LB amplifies the input signal of the GSM low frequency band, a harmonic of an integral multiple of the GSM low frequency band is also generated. This harmonic is contained in the signal of the GSM low frequency band, and is a noise component different in frequency from the amplification signal of the GSM low frequency band. Therefore, it is necessary to eliminate the harmonic component from the amplified signal of the GSM low frequency band. The low-pass filter LPF1 coupled subsequently to the output matching circuit 12a has this function. The low-pass filter LPF1 functions as a selection circuit for passing the signal of a specific frequency band in a plurality of frequency bands. That is, the low-pass filter LPF1 passes the amplification signal of the GSM low frequency band while attenuating harmonics higher in frequency than the amplification signal of the GSM low frequency band. The harmonic noise contained in the amplification signal of the GSM low frequency band can be reduced by the low-pass filter LPF1.

Also, the output matching circuit 12b and the low-pass filter LPF2 are coupled to the output of the amplifier circuit HB for generating the amplification signal of the GSM high frequency band. More specifically, the amplification signal amplified by the amplifier circuit HB included in the power amplifier 6 is inputted to the output matching circuit 12b for providing impedance matching for the amplification signal. That is, the output matching circuit 12b has the function of efficiently transferring the amplification signal amplified by the amplifier circuit HB, and is comprised of passive components such as an inductor, a capacitive element, and a resistive element. The output matching circuit 12b is a matching circuit for the signal of the GSM high frequency band because the amplification signal amplified by the amplifier circuit HB is inputted thereto.

The low-pass filter LPF2 is coupled to the output matching circuit 12b, and has the function of eliminating harmonic noise. For example, when the amplifier circuit HB amplifies the input signal of the GSM high frequency band, a harmonic of an integral multiple of the GSM high frequency band is also generated. This harmonic is contained in the signal of the GSM high frequency band, and is a noise component different in frequency from the amplification signal of the GSM high frequency band. Therefore, it is necessary to eliminate the harmonic component from the amplified signal of the GSM high frequency band. The low-pass filter LPF2 coupled subsequently to the output matching circuit 12b has this function. The low-pass filter LPF2 functions as a selection circuit for passing the signal of a specific frequency band in a plurality of frequency bands. That is, the low-pass filter LPF2 passes the amplification signal of the GSM high frequency band while attenuating harmonics higher in frequency than the amplification signal of the GSM high frequency band. The harmonic noise contained in the amplification signal of the GSM high frequency band can be reduced by the low-pass filter LPF2.

The antenna switch 8 switches between lines coupled to an antenna ANT. This line switching is performed by a selector switch. More specifically, the selector switch configuring the antenna switch 8 switches between the output of the low-pass filter LPF1 and the output of the low-pass filter LPF2 thereby to couple either thereof to the antenna ANT. That is, when the amplification signal of the GSM low frequency band outputted from the low-pass filter LPF1 is outputted from the antenna ANT, the output of the low-pass filter LPF1 is coupled to the antenna ANT by the selector switch. On the other hand, when the amplification signal of the GSM high frequency band outputted from the low-pass filter LPF2 is outputted from the antenna ANT, the output of the low-pass filter LPF2 is coupled to the antenna ANT by the selector switch. Thus, the antenna switch 8 switches between the two-line outputs (transmission states), and can perform switching in a reception state as well. In the reception state, the selector switch is operated such that a reception signal received by the antenna is outputted to reception circuits. Since there also exist a plurality of reception lines, the selector switch performs switching to a plurality of reception circuits. For example, there are provided reception terminals RX1 to RX4 for outputting reception signals, and a reception signal received by the antenna ANT is outputted to a corresponding reception circuit by switching performed by the antenna switch 8.

The selector switch configuring the antenna switch 8 is controlled by a decoder 14 formed in the antenna switch 8, based on a control signal from the baseband unit 4. The decoder 14 may be incorporated in the chip of the power amplifier 6. For example, the output/non-output of an amplified signal (RF signal (low frequency band)) to the antenna ANT is controlled by turning on/off a selector switch (switching element) formed in the antenna switch 8. The output/non-output of a reception signal from the antenna to the reception circuit is controlled by turning on/off another selector switch (switching element) formed in the antenna switch 8. Similarly, the output/non-output of an amplified signal (RF signal (high frequency band)) to the antenna ANT is controlled by turning on/off the selector switch (switching element) in the antenna switch 8.

The diplexer Di is a component for separating two different frequency bands which are the low frequency band (LB) and the high frequency band (HB), and may also be called an antenna sharing device or a branching filter. By using the diplexer Di, it is possible to separate signals of different frequency bands with only one antenna without using an extra expensive antenna switch. Further, in a transmission mode of the low frequency band (LB) and the high frequency band (HB) (in the case where a high power outputted from the power amplifier 6 is transmitted from the antenna through a switch), the turned-off switch is separated by the diplexer Di from the high power outputted from the power amplifier 6. This negates the need to contrive a circuit that can withstand high powers, which brings about an advantage of simplifying the circuit configuration.

<Operation of RF Module>

The RF module HPA according to the first embodiment is configured as described above, and the operation thereof will be described below. As shown in FIG. 2, in the first embodiment, the signal of the GSM low frequency band and the signal of the GSM high frequency band can be amplified. Since the operations thereof are the same, the operation of amplifying the signal of the GSM low frequency band will be described. While GSM is described, the communication system may be any other communication system.

As shown in FIG. 2, when a weak input signal (RF input) is inputted to the RF module HPA, the weak input signal is first inputted to the matching circuit 10a. Since the matching circuit 10a provides impedance matching for the weak input signal, the input signal is outputted to the amplifier circuit LB efficiently without reflection. Then, the input signal inputted to the amplifier circuit LB is amplified in power by the two amplification stages configuring the amplifier circuit LB. At this time, the amplification of its power by the amplifier circuit LB is controlled by the control circuit 11. More specifically, the control circuit 11 applies a bias voltage to the amplifier circuit LB, based on a power supply voltage and a control signal (power control voltage) inputted to the control circuit 11. Based on the bias voltage from the control circuit 11, the amplifier circuit LB amplifies the input signal and outputs the amplification signal. Thus, the amplification signal amplified by the power amplifier 6 is outputted.

It is desirable that the power of the amplification signal outputted from the power amplifier 6 is constant. However, due to external influences, the power of the actually outputted amplification signal is not always desirable. Therefore, feedback is applied to the control circuit 11 for controlling the amplifier circuit LB. The operation of this feedback circuit will be described.

The power of the amplification signal amplified by the amplifier circuit LB is detected by the directional coupler (not shown). The power detected by the directional coupler is converted into a voltage by the detector circuit 13a coupled to the directional coupler. A detection signal comprised of the voltage converted by the detector circuit 13a is inputted to the control circuit 11. On the other hand, the control signal (power control voltage) inputted from outside the RF module HPA is also inputted to the control circuit 11. The control circuit 11 calculates the difference between the detection signal converted by the detector circuit 13a and the control signal inputted from outside the RF module HPA. Then, the control circuit 11 controls a bias voltage to be applied to the amplifier circuit LB from the control circuit 11 so as to eliminate the calculated difference. Thus, the power of the amplification signal amplified by the amplifier circuit LB becomes constant. This operation corresponds to the operation of the feedback circuit.

Then, the amplification signal amplified by the amplifier circuit LB is inputted to the output matching circuit 12a. Since the output matching circuit 12a provides impedance matching for the amplified signal, the amplified signal is outputted to the low-pass filter LPF1 efficiently without reflection. Then, the amplification signal inputted to the low-pass filter LPF1 is processed such that higher harmonics contained in the amplification signal are eliminated by the low-pass filter LPF1. Then, the amplification signal having passed through the low-pass filter LPF1 is inputted to the antenna switch 8. At this time, the selector switch configuring the antenna switch 8 is controlled by a switch changeover control signal outputted from the baseband unit. In this case, the selector switch is controlled in such a manner that the low-pass filter LPF1 and the antenna ANT are electrically coupled to each other. Thereby, the amplification signal outputted from the low-pass filter LPF1 is outputted to the diplexer Di through the turned-on selector switch, and transmitted from the diplexer Di to the antenna ANT. Thus, the amplification signal amplified by the RF module HPA can be transmitted from the antenna ANT.

Next, the operation of capturing a reception signal received by the antenna ANT will be described. The reception signal received by the antenna ANT is inputted to the antenna switch 8 through the diplexer Di. In the antenna switch 8 to which the reception signal is inputted, the selector switch is switched by the switch changeover control signal outputted from the baseband unit. More specifically, the selector switch included in the antenna switch 8 is switched in such a manner that the antenna ANT and the reception circuit (not shown) provided outside the RF module HPA are electrically coupled to each other. In response thereto, the reception signal received by the antenna ANT is inputted to the reception circuit through the selector switch configuring the antenna switch 8. Then, the reception signal is processed in the reception circuit. Thus, the reception signal can be received.

<Configuration and Operation of Antenna Switch>

Figure 3:
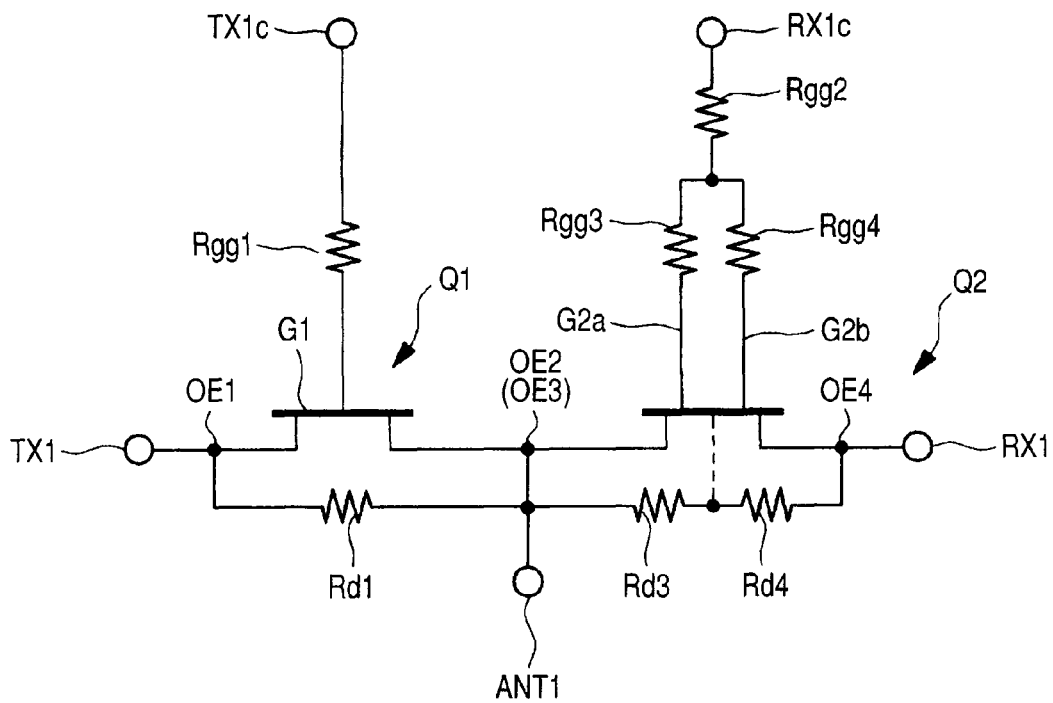
FIG. 3 is a diagram showing an example of a circuit configuring an antenna switch.

In the first embodiment, attention is focused on the antenna switch mounted in the RF module HPA. Hereinafter, the circuit configuration of the antenna switch will be described. FIG. 3 is a diagram showing an example of a circuit configuring the antenna switch. As shown in FIG. 3, the antenna switch has a transmission terminal TX1, an antenna terminal ANT1, and a reception terminal RX1. The transmission terminal TX1 is coupled to the output of the power amplifier, the antenna terminal ANT1 is coupled to the antenna, and the reception terminal RX1 is coupled to the input of the reception circuit.

A transistor Q1 as a switching element is coupled between the transmission terminal TX1 and the antenna terminal ANT1. On the other hand, a transistor Q2 as a switching element is coupled between the antenna terminal ANT1 and the reception terminal RX1. The transistor Q1 coupled between the transmission terminal TX1 and the antenna terminal ANT1 has an ohmic electrode OE1, an ohmic electrode OE2, and a gate electrode G1. The ohmic electrode OE1 is coupled to the transmission terminal TX1, and the ohmic electrode OE2 is coupled to the antenna terminal ANT1. The gate electrode G1 is coupled to a gate terminal TX1$c$ through a gate resistance Rgg1. The gate resistance Rgg1 is an isolation resistance which is provided to prevent a transmission signal flowing between the transmission terminal TX1 and the antenna terminal ANT1 from leaking out to the gate terminal TX1$c$.

The transistor Q2 coupled between the reception terminal RX1 and the antenna terminal ANT1 has an ohmic electrode OE3, an ohmic electrode OE4, and gate electrodes G2$a$ and G2$b$. The ohmic electrode OE3 is coupled to the antenna terminal ANT1, and the ohmic electrode OE4 is coupled to the reception terminal RX1. The gate electrode G2$a$ is coupled to a gate terminal RX1$c$ through a gate resistance Rgg3 and a gate resistance Rgg2, and the gate electrode G2$b$ is coupled to the gate terminal RX1$c$ through a gate resistance Rgg4 and the gate resistance Rgg2. The gate resistances Rgg2 to Rgg4 are isolation resistances which are provided to prevent a reception signal flowing between the antenna terminal ANT1 and the reception terminal RX1 from leaking out to the gate terminal RX1$c$.

The antenna switch according to the first embodiment is configured as described above, and the operation thereof will be described below. In the first embodiment, a high electron mobility transistor (HEMT) is used. The basic operation of the HEMT will be described with reference to a cross section structure shown in FIG. 4 taking as an example the transistor Q1 shown in FIG. 3. The gate electrode G1 is in contact with an AlGaAs layer 23 to form a Schottky barrier therewith. If a voltage of the gate electrode G1 with respect to the ohmic electrode (OE1 or OE2) is lower than a threshold voltage Vth (generally about −1.0 V), a high impedance is established between the ohmic electrodes OE1 and OE2, thus bringing about an off state. On the other hand, if a voltage applied to the gate electrode G1 with respect to the ohmic electrode (OE1 or OE2) is higher than the threshold voltage Vth (generally about −1.0 V), the Schottky barrier between the gate electrode G1 and the AlGaAs layer 23 is broken, so that the voltage applied to the gate electrode G1 is applied to the ohmic electrodes OE1 and OE2. At the same time, a low impedance is established between the ohmic electrodes OE1 and OE2, thus bringing about an on state. The on/off control of the transistor Q1 by the voltage between the gate electrode G1 and the ohmic electrode OE1 (OE2) can be performed by a MOSFET as well. The case where a transmission signal is transmitted from the antenna will be specifically described.

When a positive voltage (up to 3 V) is applied to the gate electrode G1 of the transistor Q1, the transistor Q1 is turned on because the voltage applied to the gate electrode G1 with respect to the ohmic electrode (OE1 or OE2) is higher than the threshold voltage Vth (generally about −1.0 V). At the same time, a voltage decreased by an amount equal to the Schottky barrier (decreased by up to about 0.5 V) is applied to the ohmic electrodes OE1 and OE2. On the other hand, in order to turn off the transistor Q2, 0 V is applied to the gate electrodes G2$a$ and G2$b$ of the transistor Q2. The voltage decreased by an amount equal to the Schottky barrier (decreased by up to about 0.5 V) from the positive voltage applied to the gate electrode G1 to turn on the transistor Q1 is applied to the ohmic electrodes OE1 and OE2 of the transistor Q1. That is, the same voltage is also applied to the ohmic electrodes OE3 and OE4 of the transistor Q2. Since 0 V is applied to the gate electrodes G2$a$ and G2$b$ of the transistor Q2, the voltage of the gate electrodes G2$a$ and G2$b$ with respect to the ohmic electrode OE3 (OE4) is lower than the threshold voltage Vth. Accordingly, the transistor Q2 is turned off.

Accordingly, the antenna terminal ANT1 is electrically coupled to the transmission terminal TX1 through the turned-on transistor Q1. In this state, the transmission signal (AC signal) inputted from the transmission terminal TX1 to the antenna switch is outputted to the antenna terminal ANT1 through the activated transistor Q1, and then transmitted from the antenna.

Next, the case where a reception signal is received by the antenna will be described. To pass the reception signal inputted through the reception terminal RX1, a positive voltage is applied to the gate electrodes G2$a$ and G2$b$ of the transistor Q2 (a positive voltage is applied to the gate terminal RX1$c$), and 0 V is applied to the gate electrode G1 of the transistor Q1. Since the positive voltage is applied to the gate electrodes G2a and G2b, the transistor Q2 is turned on. At the same time, a voltage decreased by the Schottky barrier (decreased by up to about 0.5 V) is applied to the ohmic electrodes OE3 and OE4. The same positive voltage as applied to the ohmic electrodes OE3 and OE4 of the transistor Q2 is applied to the ohmic electrodes OE1 and OE2 of the transistor Q1. Since 0 V is applied to the gate electrode G1 of the transistor Q1, the voltage of the gate electrode G1 with respect to the ohmic electrode OE1 (OE2) is lower than the threshold voltage Vth. Accordingly, the transistor Q1 is turned off.

Accordingly, the antenna terminal ANT1 is electrically coupled to the reception terminal RX1 through the turned-on transistor Q2. In this state, the reception signal (AC signal) inputted from the antenna terminal ANT1 to the antenna switch is outputted to the reception terminal RX1 through the activated transistor Q2, and then inputted to the reception circuit.

Thus, by turning on the transistor Q1 and turning off the transistor Q2 at the time of transmission, the transmission signal inputted from the transmission terminal TX1 can be transmitted from the antenna terminal ANT1. On the other hand, by turning off the transistor Q1 and turning on the transistor Q2 at the time of reception, the reception signal inputted from the antenna terminal ANT1 can be outputted to the reception circuit.

Hereinafter, consideration will be given to the case where the transmission signal is outputted from the antenna switch. The transmission signal has a high power exceeding e.g. 1 W, and it is necessary to suppress higher harmonics contained in the transmission signal. That is, it is desirable to contain only a predetermined frequency band in the transmission signal transmitted from the antenna. However, when the transmission signal is amplified by, e.g., the power amplifier 6 of the RF module HPA shown in FIG. 2, the second and third harmonics of the use frequency also occur. Therefore, if the transmission signal outputted from the power amplifier 6 is transmitted as it is, harmonics higher than the use band are contained, which causes a problem in terms of a radio law. That is, the frequency band of the transmission signal is defined beforehand, and the occurrence of a signal beyond the defined frequency band interferes with other signals. Therefore, it is necessary to reduce the occurrence of higher harmonics. For this reason, as shown in FIG. 2, the transmission signal amplified by the power amplifier 6 passes through the low-pass filters LPF1 and LPF2 which eliminate the higher harmonics contained in the transmission signal.

However, even the low-pass filters LPF1 and LPF2 cannot completely eliminate the higher harmonics. In addition, higher harmonics occur in the antenna switch to which the transmission signal is inputted after passing through the low-pass filters LPF1 and LPF2. Therefore, it is also necessary to reduce the higher harmonics which occur in the antenna switch. More specifically, the antenna switch is comprised of the transistor Q1 and the transistor Q2 as shown in FIG. 3. At the time of transmitting the transmission signal, the transistor Q1 is turned on, and the transistor Q2 is turned off. At this time, higher harmonics occur from the turned-on transistor Q1, and higher harmonics also occur from the turned-off transistor Q2.

First, a configuration for reducing the occurrence of higher harmonics in both the turned-on transistor Q1 and the turned-off transistor Q2 is adopted. For example, a resistance Rd1 is provided between the ohmic electrodes OE1 and OE2 of the transistor Q1. Similarly, resistances Rd3 and Rd4 are provided between the ohmic electrodes OE3 and OE4 of the transistor Q2. The reason thereof will be described. Consideration will be given to, e.g., the transistor Q1. By coupling the resistance Rd1 between the ohmic electrodes OE1 and OE2 of the transistor Q1, the ohmic electrodes OE1 and OE2 are maintained at the same DC potential. If the ohmic electrodes OE1 and OE2 are not at the same DC potential, nonlinearity between the ohmic electrodes OE1 and OE2 is actualized. Due to the actualization of nonlinearity, higher harmonics occur when the transmission signal passes. That is, the nonlinearity between the ohmic electrodes OE1 and OE2 of the transistor Q1 is a factor in causing higher harmonics in the transmission signal. For this reason, the ohmic electrodes OE1 and OE2 are maintained at the same DC potential through the resistance Rd1, thereby making it possible to suppress the occurrence of higher harmonics. Similarly, by providing the resistances Rd3 and Rd4 between the ohmic electrodes OE3 and OE4 of the transistor Q2, the ohmic electrodes OE3 and OE4 are maintained at the same DC potential.

It might be considered that, in FIG. 3, for example, if the resistance Rd1 is coupled between the ohmic electrodes OE1 and OE2, there is continuity between the ohmic electrodes OE1 and OE2 even when the transistor Q1 is turned off. However, the ohmic electrodes OE1 and OE2 are at the same potential in terms of DC and the resistance Rd1 has a resistance large enough to block an AC RF signal; therefore, the AC RF signal does not flow between the ohmic electrodes OE1 and OE2 when the transistor Q1 is turned off.

Next, description will be made of a configuration for reducing the occurrence of higher harmonics in the turned-off transistor Q2. As shown in FIG. 3, the transistor Q2 turned off at the time of transmission has the gate electrodes G2a and G2b. That is, the transistor Q2 has a dual gate structure. With this, it is possible to reduce higher harmonics which occur from the transistor Q2 turned off at the time of transmission. The reason thereof will be described. For example, as shown in FIG. 3, the transistor Q2 is turned off at the time of transmission. For this reason, it might be considered that the ohmic electrodes OE3 and OE4 of the transistor Q2 are in a floating state. However, in reality, the reception terminal RX1 is coupled to a reference potential (GND potential) through a resistance. Therefore, when the transmission signal is transferred from the transmission terminal TX1 to the antenna terminal ANT1, the RF voltage is applied between the antenna terminal ANT1 and the reception terminal RX1. That is, due to the off-capacitance of the transistor Q2, the RF voltage is applied between the ohmic electrodes OE3 and OE4 of the transistor Q2. As the RF voltage increases, the occurrence of higher harmonics from the turned-off transistor Q2 increases. For this reason, in the first embodiment, the transistor Q2 has the dual gate structure. That is, the gate electrode of the transistor Q2 is comprised of the two gate electrodes G2a and G2b, thereby dividing the off-capacitance formed between the ohmic electrodes OE3 and OE4. As a result, it is possible to decrease the RF voltage applied to each of the divided off-capacitances. Thus, since the RF voltage applied to each off-capacitance of the transistor Q2 decreases, it is possible to reduce higher harmonics that occur from the transistor Q2.

Next, description will be made of a configuration for reducing the occurrence of higher harmonics in the turned-on transistor Q1. According to the characteristic of the first embodiment, higher harmonics which occur from the transistor Q1 turned on at the time of transmission is reduced by contriving the configuration of the turned-on transistor Q1. The device structure of the transistor Q1 will be described before describing the characteristic point of the first embodiment.

<Device Structure of Transistor Configuring Antenna Switch>

The transistors Q1 and Q2 configuring the antenna switch are comprised of, e.g., an HEMT (High Electron Mobility Transistor) which is a type of field effect transistor. The device structure of the HEMT will be described.

Figure 4:
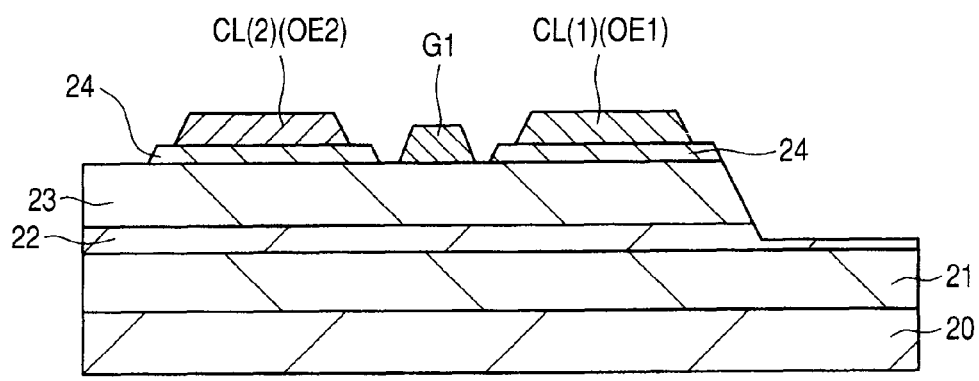
FIG. 4 is a cross sectional view showing the structure of a high electron mobility transistor.

FIG. 4 is a cross sectional view showing the structure of the HEMT according to the first embodiment. In FIG. 4, an epitaxial layer 21 is formed over a semi-insulating substrate 20. The semi-insulating substrate 20 is comprised of a GaAs substrate of a compound semiconductor, and will be described below. That is, if a certain type of impurities are added in a compound semiconductor having a large band gap, a deep level is formed in the band gap. Further, electrons and positive holes of the deep level are fixed, and the electron density of a conduction band or the hole density of a valence band decreases greatly, so that the compound semiconductor becomes nearly insulation. Such a substrate is called the semi-insulating substrate. In the GaAs substrate, Cr, In, oxygen, or the like is added or arsenic is introduced excessively, so that a deep level is formed for a semi-insulating substrate.

The epitaxial layer 21 formed over the semi-insulating substrate 20 is formed of, e.g., a GaAs layer. A buffer layer 22 is formed over the epitaxial layer 21, and the AlGaAs layer 23 is formed over the buffer layer 22. The AlGaAs layer 23 is processed in mesa shape and subjected to shallow trench isolation. Further, the gate electrode G1 is formed over the AlGaAs layer 23. The gate electrode G1 is formed of a metal layer in which the lowermost layer is, e.g., Pt (platinum), that is, a laminated film in which Pt, Ti (titanium), Pt, Au (gold) are laminated in order from the underlayer. With this, the AlGaAs layer 23 and the gate electrode G1 (Pt of the lowermost layer) form the Schottky barrier. Further, n-type GaAs layers 24 are formed with the gate electrode G1 spaced therebetween, and the ohmic electrodes OE1 and OE2 are formed over the n-type GaAs layers 24. The ohmic electrodes OE1 and OE2 make ohmic-contact with the n-type GaAs layers 24. As will be described later, the ohmic electrode OE1 is integrally formed with a comb-like electrode CL(1), and the ohmic electrode OE2 is integrally formed with a comb-like electrode CL(2).

In the high electron mobility transistor (HEMT), the epitaxial layer 21 (GaAs layer) and the AlGaAs layer 23 both high in resistance are formed over the semi-insulating substrate (compound semiconductor substrate) 20, and a triangular potential well developed at a heterojunction interface between the GaAs layer and the AlGaAs layer is utilized. The high electron mobility transistor (HEMT) has a Schottky barrier type gate electrode G1 with a metal film formed over the surface of the AlGaAs layer 23 and has a structure in which the ohmic source electrode (ohmic electrode OE1) and the ohmic drain electrode (ohmic electrode OE2) for passing current through the heterojunction interface are provided with the gate electrode G1 interposed therebetween.

The high electron mobility transistor (HEMT) utilizes a two-dimensional electron gas formed in the potential well as carriers. Since the width of the potential well existing in the heterojunction interface is about as small as the wavelength of each electron, and the electron can only take two-dimensional motion substantially along the interface, high electron mobility can be obtained. Accordingly, since the high electron mobility transistor is excellent in high frequency characteristic and high-speed characteristic with the high mobility characteristic of the two-dimensional electron gas and very low in noise, the high electron mobility transistor is used in the antenna switch for which high-speed capability is required.

<Layout Structure of Transistor (Characteristic Configuration of Invention)>

Figure 5:
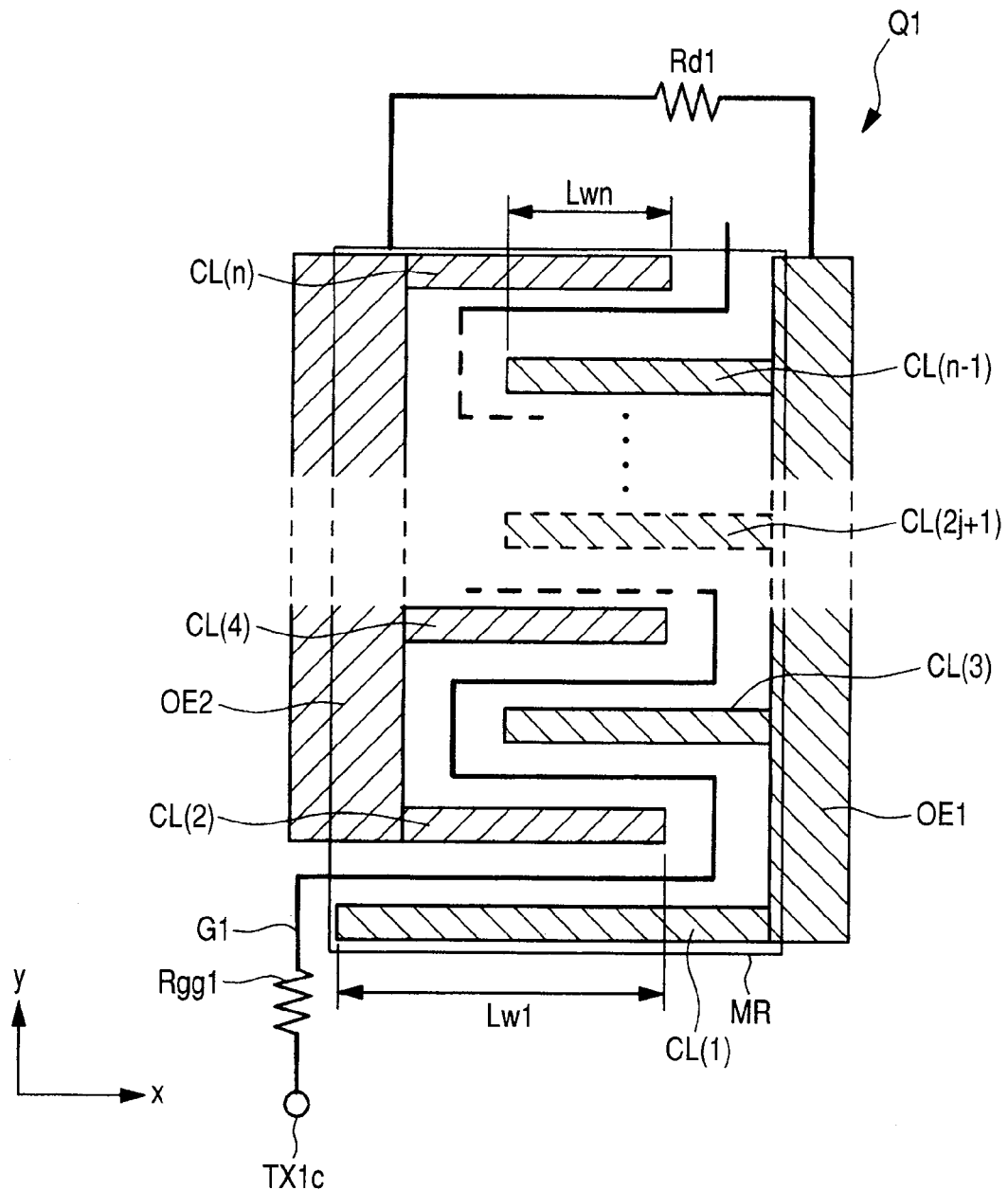
FIG. 5 is a diagram showing the layout configuration of a transistor according to the first embodiment.

Next, description will be made of the layout configuration of the transistor Q1 including the characteristic point of the first embodiment. FIG. 5 is a diagram showing the layout configuration of the transistor Q1 according to the first embodiment. In FIG. 5, the ohmic electrode OE1 and the ohmic electrode OE2 are formed to extend in the y-axis direction. That is, the ohmic electrode OE1 and the ohmic electrode OE2 are disposed to be spaced by a given distance and extend in the y-axis direction. A plurality of comb-like electrodes CL(1), CL(3), ..., CL(2j+1) are formed on the surface, facing the ohmic electrode OE2, of the ohmic electrode OE1. The comb-like electrodes CL(1), CL(3), ..., CL(2j+1) are disposed to project in the x-axis direction. Similarly, a plurality of comb-like electrodes CL(2), CL(4), ..., CL(n) are formed on the surface, facing the ohmic electrode OE1, of the ohmic electrode OE2. The comb-like electrodes CL(2), CL(4), ..., CL(n) are also disposed to project in the x-axis direction. The comb-like electrodes CL(1), CL(3), ..., CL(2j+1) and the comb-like electrodes CL(2), CL(4), ..., CL(n) are formed in a mesa region MR.

The comb-like electrodes CL(1), CL(3), ..., CL(2j+1) electrically coupled to the ohmic electrode OE1 and the comb-like electrodes CL(2), CL(4), ..., CL(n) electrically coupled to the ohmic electrode OE2 are alternately disposed in comb shape. Further, the gate electrode G1 is formed along the space formed between the comb-like electrodes CL(1), CL(3), ..., CL(2j+1) and the comb-like electrodes CL(2), CL(4), ..., CL(n). That is, the gate electrode G1 extends meandering along the space formed between the comb-like electrodes CL(1), CL(3), ..., CL(2j+1) and the comb-like electrodes CL(2), CL(4), ..., CL(n). In this case, the gate electrode G1 is coupled to the gate terminal TX1c through the gate resistance Rgg1. Further, the ohmic electrode OE1 and the ohmic electrode OE2 are coupled through the resistance Rd1.

The transistor Q1 according to the first embodiment is configured as described above. In this specification, the above-described layout configuration of the transistor Q1 is called a meander structure. According to the meander structure, it is possible to reduce the occurrence of higher harmonics of the transistor Q1. That is, in the meander structure, the gate width (length along which the gate electrode G1 extends) of the gate electrode G1 can be increased. This means that it is possible to reduce the on-resistance between the ohmic electrodes OE1 and OE2 of the transistor Q1. Due to the reduction of the on-resistance, it is possible to reduce the occurrence of higher harmonics caused by the nonlinear component of the on-resistance. That is, the meander structure can improve area efficiency to increase the gate width of the gate electrode G1 in a given area. Accordingly, it is possible to increase the gate width of the gate electrode G1 in a defined area.

Therefore, in terms of reducing higher harmonics which occur from the transistor Q1 turned on at the time of transmission, it is desirable to increase the gate width of the gate electrode G1. However, with increasing gate width of the gate electrode G1, an area occupied by the transistor Q1 increases. Therefore, in terms of miniaturizing a semiconductor chip forming the transistor Q1 and reducing cost, it is not desirable to increase the gate width of the gate electrode G1.

Further, an increase in the gate width of the gate electrode G1 causes a side effect which will be described below. In FIG. 3, in the case of receiving the reception signal, the transistor Q1 is turned off, and the transistor Q2 is turned on. Accordingly, at the time of reception, the antenna terminal ANT1 and the reception terminal RX1 are electrically coupled through the activated transistor Q2, and the reception signal received by the antenna is outputted to the reception circuit through the reception terminal RX1 from the antenna terminal ANT1. At this time, since the transistor Q1 is turned off and deactivated, the transistor Q1 has an off-capacitance. If the off-capacitance is large, the reception signal flowing from the antenna terminal ANT1 to the reception terminal RX1 leaks out to the transmission terminal TX1 due to the off-capacitance of the transistor Q1. This decreases the reception signal transferred to the reception circuit, which makes it difficult to process the reception signal, thus preventing correct reception. Therefore, it is desirable that the off-capacitance of the transistor Q1 is not large.

However, an increase in the gate width of the gate electrode G1 configuring the transistor Q1 increases the off-capacitance of the transistor Q1. For this reason, the gate width of the gate electrode G1 cannot be increased greatly. That is, in terms of adjusting the gate width of the gate electrode G1 of the transistor Q1, there is a trade-off between reduction in the occurrence of higher harmonics from the transistor Q1 and reduction in the off-capacitance of the transistor Q1. Therefore, to suppress the occurrence of higher harmonics from the transistor Q1 and reduce the off-capacitance of the transistor Q1, the area for forming the transistor Q1, and cost, it is necessary to provide a structure for reducing the occurrence of higher harmonics maximally in a defined area. That is, the gate width of the transistor Q1 is set to a defined width so as to satisfy reductions in the area, cost, and off-capacitance of the transistor Q1, and it is important to reduce the occurrence of higher harmonics in this condition. Hereinafter, description will be made of the characteristic configuration of the first embodiment which can suppress the occurrence of higher harmonics maximally within the defined gate width.

According to the characteristic configuration of the first embodiment in FIG. 5, the length of the comb-like electrode CL(1) is made greater than the lengths of the other comb-like electrodes CL(3) to CL(2j+1) and CL(2) to CL(n). That is, the comb-like electrode CL(1) is formed to have the greatest length so that the length of the comb-like electrode CL(1) is made greater than the lengths of the other comb-like electrodes CL(3) to CL(2j+1) and CL(2) to CL(n). In description, the lengths of the comb-like electrodes CL(1) to CL(2j+1) and CL(2) to CL(n) are used; however, to be accurate, the magnitude relation among finger lengths is used. The finger lengths are defined as follows. For example, a finger length Lw1 refers to the portion of the comb-like electrode CL(1) that faces the comb-like electrode CL(2) as shown in FIG. 5. In other words, the finger length Lw1 is the length overlapped between the comb-like electrode CL(1) and the comb-like electrode CL(2) projected on the x-axis. Similarly, the finger length Lwn is defined as the length overlapped between the comb-like electrode CL(n−1) and the comb-like electrode CL(n) projected on the x-axis. Therefore, according to the characteristic configuration of the first embodiment, the length of the comb-like electrode CL(1) is made greater than the lengths of the other comb-like electrodes CL(3) to CL(2j+1) and CL(2) to CL(n), or the finger length Lw1 is made greater than any other finger length Lwj.

In the first embodiment, the comb-like electrode CL(1) (finger length Lw1) is made longer than any other comb-like electrode CL(j) (finger length Lwj). The comb-like electrode CL(1) (finger length Lw1) mentioned above refers to the comb-like electrode that is closest to the input side of the gate electrode G1. That is, in FIG. 5, the gate electrode G1 extends from the gate terminal TX1c through the gate resistance Rgg1, and the comb-like electrode CL(1) (finger length Lw1) closest to the input side of the gate electrode G1 coupled to the gate terminal TX1c, of the comb-like electrodes CL(j) (finger lengths Lwj) configuring the meander structure has the greatest length.

With this configuration, it is possible to suppress the occurrence of higher harmonics maximally within the defined gate width. Hereinafter, the reason thereof will be described qualitatively.

<Qualitative Reason to Reduce Occurrence of Higher Harmonics>

Figure 6:
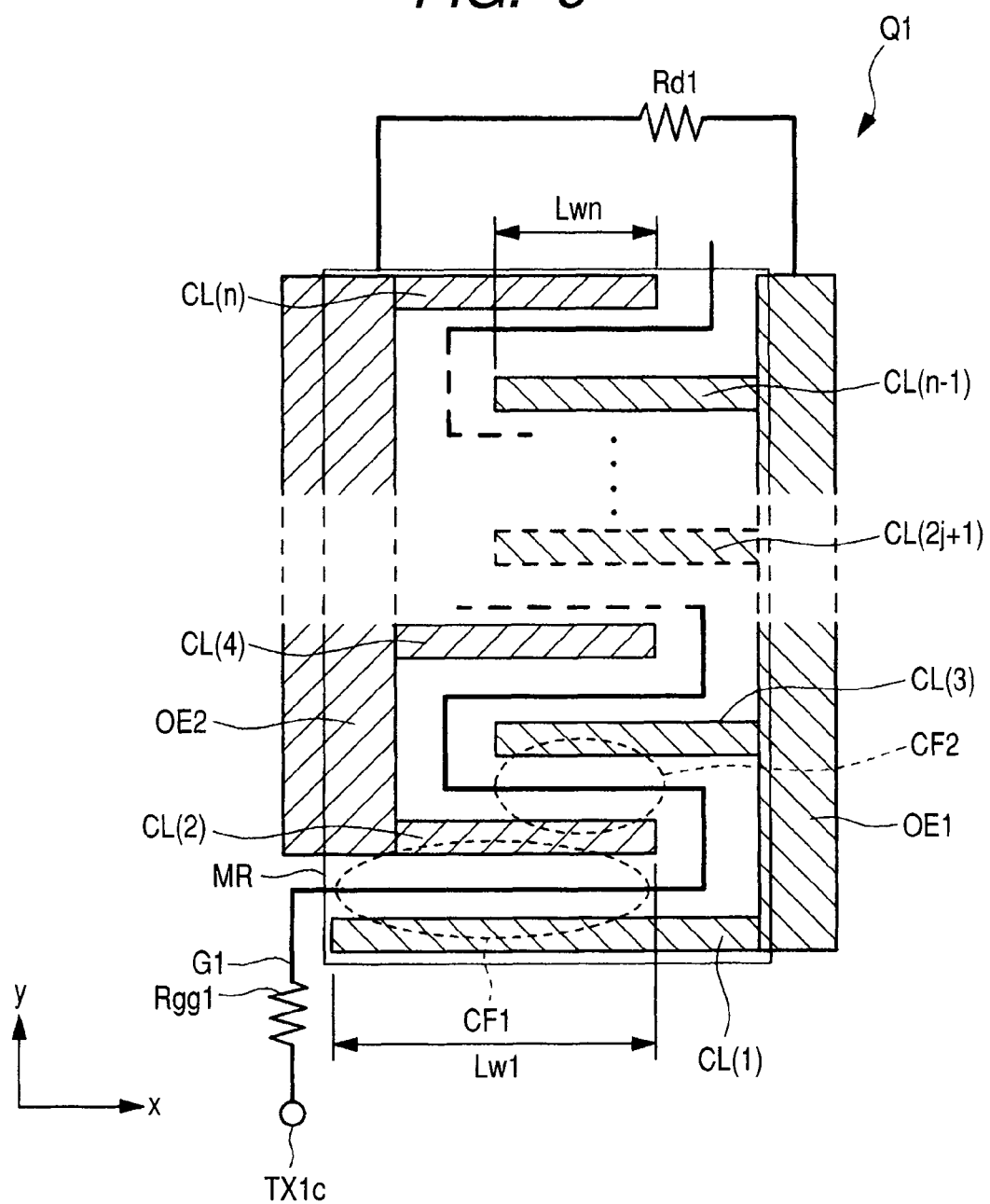
FIG. 6 is a plan view showing a meander structure according to the first embodiment.

FIG. 6 is a plan view showing the meander structure according to the first embodiment. As shown in FIG. 6, the transistor Q1 configuring the antenna switch has the meander structure. One transistor Q1 formed with the meander structure shown in FIG. 6 is comprised of a plurality of partial transistors CF1, CF2, ..., CFj. More specifically, as seen in FIG. 6, one transistor Q1 formed with the meander structure has a structure in which the partial transistors CF1, CF2, ..., CFj are coupled in parallel. For example, the partial transistor CF1 is comprised of a pair of ohmic electrodes which are the comb-like electrodes CL(1) and CL(2) and the gate electrode G1 disposed therebetween. More specifically, the partial transistor CF1 is a transistor corresponding to the finger length Lw1. Similarly, the partial transistor CF2 is comprised of a pair of ohmic electrodes which are the comb-like electrodes CL(2) and CL(3) and the gate electrode G1 disposed therebetween. More specifically, the partial transistor CF2 is a transistor corresponding to the finger length Lw2 (not shown).

Figure 7:
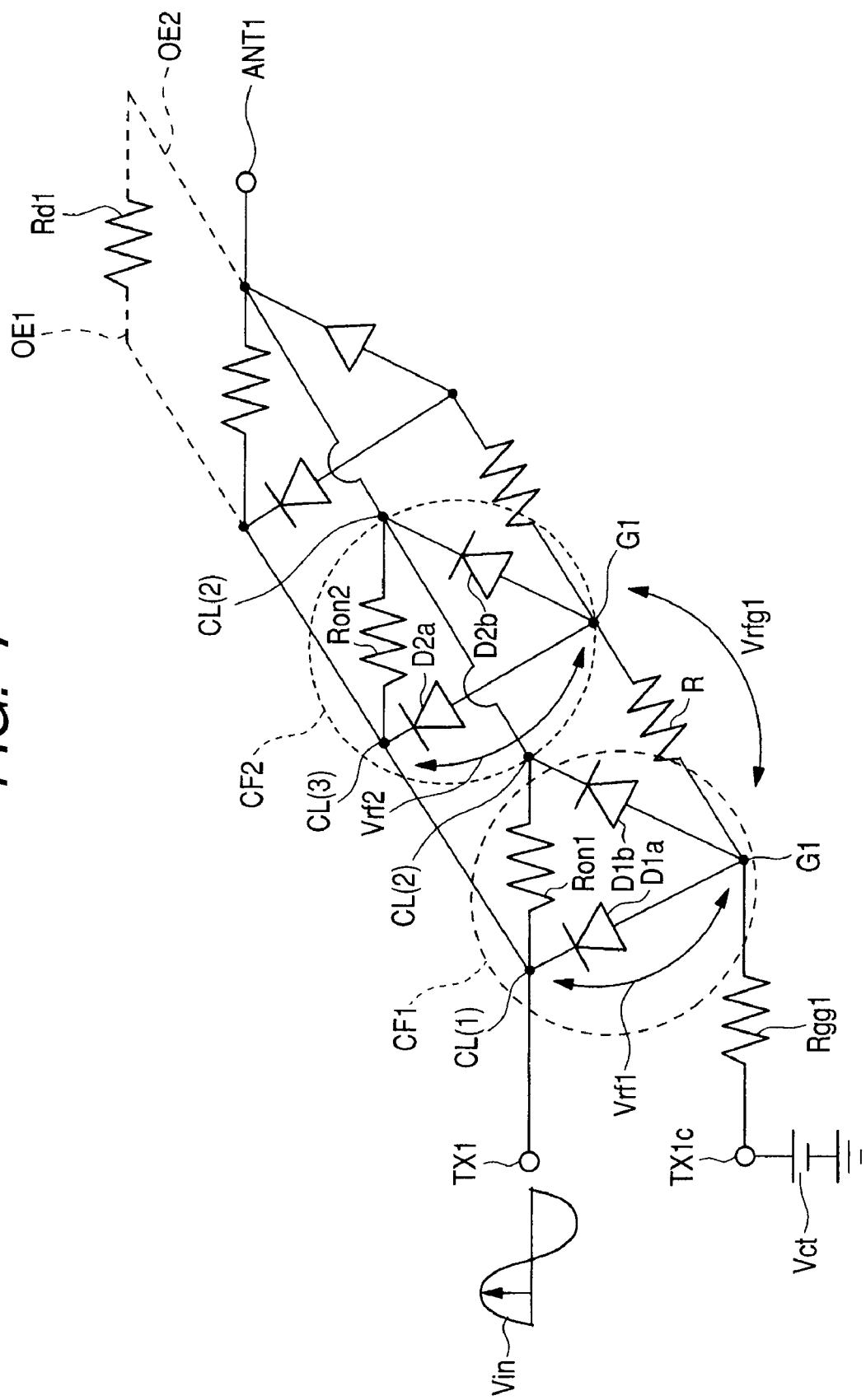
FIG. 7 is an equivalent circuit diagram of one turned-on transistor (HEMT) with the meander structure.

As described above, one transistor Q1 with the meander structure is formed by coupling the partial transistors CF1, CF2, ..., CFj in parallel. Based on this, an equivalent circuit diagram of one transistor with the meander structure will be described. FIG. 7 is an equivalent circuit diagram of one turned-on transistor Q1 with the meander structure. In FIG. 7, the transmission terminal TX1 is disposed at the extreme left, the ohmic electrode OE1 is electrically coupled to the transmission terminal TX1, and on-resistances Ron1, Ron2, are formed between the ohmic electrodes OE1 and OE2. Further, the antenna terminal ANT1 is coupled to the ohmic electrode OE2. In this case, the on-resistance Ron1 which couples the ohmic electrode OE1 with the ohmic electrode OE2 is the on-resistance between the comb-like electrodes CL(1) and CL(2) of the partial transistor CF1. Similarly, the on-resistance Ron2 which couples the ohmic electrode OE1 with the ohmic electrode OE2 is the on-resistance between the comb-like electrodes CL(2) and CL(3) of the partial transistor CF2. Thus, from the equivalent circuit as well, it can be seen that the partial transistor CF1 and the partial transistor CF2 are coupled in parallel between the ohmic electrodes OE1 and OE2.

Further, one end of the gate terminal TX1c is coupled to the reference potential (GND potential) through a DC power supply Vct, and the other end of the gate terminal TX1c is electrically coupled to the gate electrode G1 through the gate resistance Rgg1. In the partial transistor CF1, a Schottky barrier diode D1a is coupled between the gate electrode G1 and the comb-like electrode CL(1), and a Schottky barrier diode D1b is coupled between the gate electrode G1 and the comb-like electrode CL(2).

The gate electrode G1 of the HEMT and the AlGaAs layer 23 (shown in FIG. 4) form the Schottky barrier. It is effective to use Schottky diodes to represent the coupling of the gate electrode G1 to the ohmic electrodes OE1 and OE2 in an equivalent circuit. Since the partial transistor CF1 has the same structure, the partial transistor CF1 is replaced by the equivalent circuit in which the gate electrode G1 is coupled to the comb-like electrode CL(1) through a Schottky diode and coupled to the comb-like electrode CL(2) through another Schottky diode.

Similarly, in the partial transistor CF2, the gate electrode G1 is disposed through a resistance R from the gate electrode G1 of the partial transistor CF1. In consideration of the wiring resistance of the gate electrode G1, the resistance R exists between the gate electrode G1 of the partial transistor CF1 and the gate electrode G1 of the partial transistor CF2. That is, since the partial transistor CF2 is away from the input side of the gate electrode G1 as compared to the partial transistor CF1, the wiring resistance corresponding to the distance is taken into consideration. In the thus-configured partial transistor CF2 as well, it can be considered that a Schottky barrier diode D2a is coupled between the gate electrode G1 and the comb-like electrode CL(3) and a Schottky barrier diode D2b is coupled between the gate electrode G1 and the comb-like electrode CL(2).

Thus, the circuit configuration of one transistor Q1 with the meander structure is shown by the equivalent circuit diagram in FIG. 7. Next, consideration will be given to the case where a radiofrequency (RF) voltage (represented by a sine wave in FIG. 7) Vin is inputted to the transmission terminal TX1, with reference to the equivalent circuit diagram shown in FIG. 7. First, when the transmission signal is inputted to the transmission terminal TX1, since the partial transistors CF1, CF2, ..., CFj are turned on, the transmission signal is outputted from the antenna terminal ANT1 through the on-resistances Ron1, Ron2, ..., Ronj. Therefore, by reducing the on-resistances Ron1, Ron2, ..., Ronj, it is possible to suppress the occurrence of higher harmonics caused by the nonlinearity of the on-resistances Ron1, Ron2, ..., Ronj.

Further, when the radiofrequency (RF) voltage (represented by a sine wave in FIG. 7) Vin is inputted to the transmission terminal TX1, since the gate electrode G1 is coupled to the reference potential (GND potential) through the gate resistance Rgg1, the RF voltage is applied between the transmission terminal TX1 and the gate terminal TX1c. More specifically, in the partial transistor CF1, the RF voltage is divided by the impedances of the gate resistance Rgg1 and the Schottky barrier diode D1a, so that an RF voltage Vrf1 is applied across the Schottky barrier diode D1a. Similarly, in the partial transistor CF2, the RF voltage is divided by the impedances of the gate resistance Rgg1, the resistance R, and the Schottky barrier diode D2a, so that an RF voltage Vrf2 is applied across the Schottky barrier diode D2a. Thus, the RF voltages Vrf1, Vrf2, ..., Vrfj are applied across the Schottky barrier diodes D1a, D2a, ..., Dja configuring the partial transistors CF1, CF2, ..., CFj, respectively.

For example, in the partial transistor CF1, the RF voltage Vrf1 is applied across the Schottky barrier diode D1a. When the RF voltage Vrf1 is applied across the Schottky barrier diode D1a, higher harmonics occur due to the nonlinearity of the Schottky barrier diode D1a. The higher harmonics which occur from the Schottky barrier diode D1a increase as the RF voltage Vrf1 applied across the Schottky barrier diode D1a increases. Therefore, if it is possible to decrease the RF voltage Vrf1 which occurs across the Schottky barrier diode D1a, it is possible to suppress the occurrence of higher harmonics.

Hereinafter, consideration will be given to the magnitude relation among the RF voltages Vrf1, Vrf2, ..., Vrfj applied across the Schottky barrier diodes D1a, D2a, ..., Dja configuring the partial transistors CF1, CF2, ..., CFj respectively. As shown in FIG. 7, the RF voltage Vrf1 applied across the Schottky barrier diode D1a in the partial transistor CF1 is determined by the impedance ratio between the gate resistance Rgg1 and the Schottky barrier diode D1a. On the other hand, the RF voltage Vrf2 applied across the Schottky barrier diode D2a in the partial transistor CF2 is determined by the impedance ratio among the gate resistance Rgg1, the resistance R, and the Schottky barrier diode D2a. Therefore, the RF voltage Vrf1 applied across the Schottky barrier diode D1a configuring the partial transistor CF1 is larger than the RF voltage Vrf2 applied across the Schottky barrier diode D2a configuring the partial transistor CF2. That is, in the partial transistor CF2, since the resistance R exists due to gate wiring, the RF voltage Vrf2 applied across the Schottky barrier diode D2a configuring the partial transistor CF2 is inevitably smaller than the RF voltage Vrf1 applied across the Schottky barrier diode D1a configuring the partial transistor CF1 by an RF voltage Vrfg1 applied across the resistance R. Similarly, the RF voltages Vrf1, Vrf2, ..., Vrfj applied across the Schottky barrier diodes D1a, D2a, ..., Dja decrease with proceeding partial transistors from CF1 to CFj. That is, the RF voltage Vrf1 is the highest. Since the occurrence of higher harmonics increases as the RF voltage increases, the partial transistor CF1 causes the largest occurrence of higher harmonics. Since the partial transistors CF1, CF2, ..., CFj are coupled in parallel, higher harmonics which occur from the partial transistors CF1, CF2, ..., CFj are outputted to the antenna ANT through the antenna terminal ANT1 without attenuation.

From this fact, if it is possible to suppress higher harmonics that occur from the partial transistor CF1 closest to the gate terminal TX1c (in other words, the gate input side), it is possible to sufficiently suppress the occurrence of higher harmonics from the transistor Q1. In the partial transistor CF1, the RF voltage applied across the Schottky barrier diode D1a can be decreased by decreasing the impedance of the Schottky barrier diode D1a. The impedance of the Schottky barrier diode D1a can be decreased by increasing the gate width of the partial transistor CF1. For this reason, in the first embodiment, the gate width of the partial transistor CF1 closest to the gate input side is increased. More specifically, as shown in FIG. 6, the comb-like electrode CL(1) is made longer than the other comb-like electrodes CL(2) to CL(n). In other words, the finger length Lw1 of the partial transistor CF1 is made greater than the finger length Lwj of any other comb-like electrode. This can increase the gate width of the partial transistor CF1 closest to the gate input side. As a result, the impedance of the Schottky barrier diode D1a configuring the partial transistor CF1 decreases, so that it is possible to decrease the RF voltage Vrf1 applied across the Schottky barrier diode D1a. Thus, it is possible to suppress the occurrence of higher harmonics caused by the nonlinearity of the Schottky barrier diode D1a. As described above, according to the first embodiment, it is possible to suppress the occurrence of higher harmonics maximally within the defined gate width. This means that it is possible to suppress the occurrence of higher harmonics from the transistor Q1 and reduce the off-capacitance of the transistor Q1, the area for forming the transistor Q1, and cost.

<Quantitative Reason to Reduce Higher Harmonics>

Next, the reduction of higher harmonics according to the first embodiment will be described quantitatively. In the first embodiment, higher harmonics which occur from the transistor Q1 turned on at the time of transmission are calculated by simulation using the equivalent circuit diagram shown in FIG. 7. As simulation conditions, the power of the input signal is 35 dBm, and the frequency of the input signal is 880 MHz. The gate width Wg of the transistor Q1 having the meander structure is 2050 μm, and the number of fingers is 20, which are fixed in the evaluation.

FIG. 8 is a table showing a simulation result achieved in the first embodiment. In FIG. 8, the finger length of the partial transistor closest to the gate input side is indicated by a finger length Lw1, and the finger length of the other partial transistors is indicated by a finger length Lwn. First, consideration will be given to the leftmost data. In the leftmost data, the finger length Lw1 is the same as the finger length Lwn which is 102.5 µm. That is, the finger length Lw1 divided by the finger length Lwn is 1. This indicates that the finger lengths of the individual partial transistors are all the same. In this case, the RF voltage Vrf1 applied across the Schottky barrier diode of the partial transistor closest to the gate input side is 1.23 V, and the RF voltage Vrfn applied across the Schottky barrier diodes of the other partial transistors is 1.08 V. The higher harmonic (third harmonic 3HD) which occurs from the transistor Q1 is 63.19 dBc.

Next, consideration will be given to the center data in FIG. 8. In the center data, the finger length Lw1 is 150.00 µm, and the finger length Lwn is 100.00 µm. That is, the finger length Lw1 divided by the finger length Lwn is 1.5. This indicates that the finger length Lw1 of the partial transistor closest to the gate input side is greater than the finger length Lwn of the other partial transistors. This is a structure for achieving the characteristic of the first embodiment. In this case, the RF voltage Vrf1 applied across the Schottky barrier diode of the partial transistor closest to the gate input side is 1.14 V, and the RF voltage Vrfn applied across the Schottky barrier diodes of the other partial transistors is 1.00 V. The higher harmonic (third harmonic 3HD) which occurs from the transistor Q1 is 65.22 dBc. In the table, the third harmonic is expressed in decibels. This decibel expression indicates how much the magnitude of the higher harmonic is attenuated from an input power Pin. That is, as the decibel value of the third harmonic increases, the attenuation increases, and the magnitude of the third harmonic decreases. In comparison between the leftmost data and the center data, the level of the higher harmonic is 63.19 dBc in the leftmost data, whereas it is 65.22 dBc in the center data. This indicates that the center data can suppress the occurrence of the higher harmonic, compared to the leftmost data. That is, if the finger length Lw1 of the partial transistor closest to the gate input side is made greater than the finger length Lwn of the other partial transistors, it is possible to suppress the occurrence of the higher harmonic.

This can be considered as follows. That is, the magnitude of the higher harmonic increases in proportion to the magnitude of the RF voltage applied across the partial transistor. The RF voltage applied across the partial transistor increases as the impedance of the Schottky barrier diode configuring the partial transistor and the impedance of the resistance between a pair of ohmic electrodes increase. The impedance of the Schottky barrier diode and the impedance of the resistance between a pair of ohmic electrodes depend on the gate width (finger length) of the partial transistor, and decrease as the gate width (finger length) of the partial transistor increases. Accordingly, as shown in FIG. 8, the RF voltage Vrf1 which is the highest in the RF voltages applied across the partial transistors decreases by increasing the finger length Lw1 of the partial transistor closest to the gate input side. Consequently, it is possible to suppress the occurrence of the higher harmonic.

Further, consideration will be given to the rightmost data in FIG. 8. In the rightmost data, the finger length Lw1 is 187.96 µm, and the finger length Lwn is 98.00 µm. That is, the finger length Lw1 divided by the finger length Lwn is 1.92. This indicates that the finger length Lw1 of the partial transistor closest to the gate input side is greater than the finger length Lwn of the other partial transistors. This is a structure for further achieving the characteristic of the first embodiment. In this case, the RF voltage Vrf1 applied across the Schottky barrier diode of the partial transistor closest to the gate input side is 1.08 V, and the RF voltage Vrfn applied across the Schottky barrier diodes of the other partial transistors is 0.95 V. The higher harmonic (third harmonic 3HD) which occurs from the transistor Q1 is 66.99 dBc.

Thus, the greater the finger length Lw1 of the partial transistor closest to the gate input side is than the finger length Lwn of the other partial transistors, the more the occurrence of the higher harmonic can be suppressed.

Second Embodiment

While the example in which the invention is applied to the transistor of the single gate structure has been described in the first embodiment, an example in which the invention is applied to a transistor of a dual gate structure will be described in the second embodiment.

Figure 9:
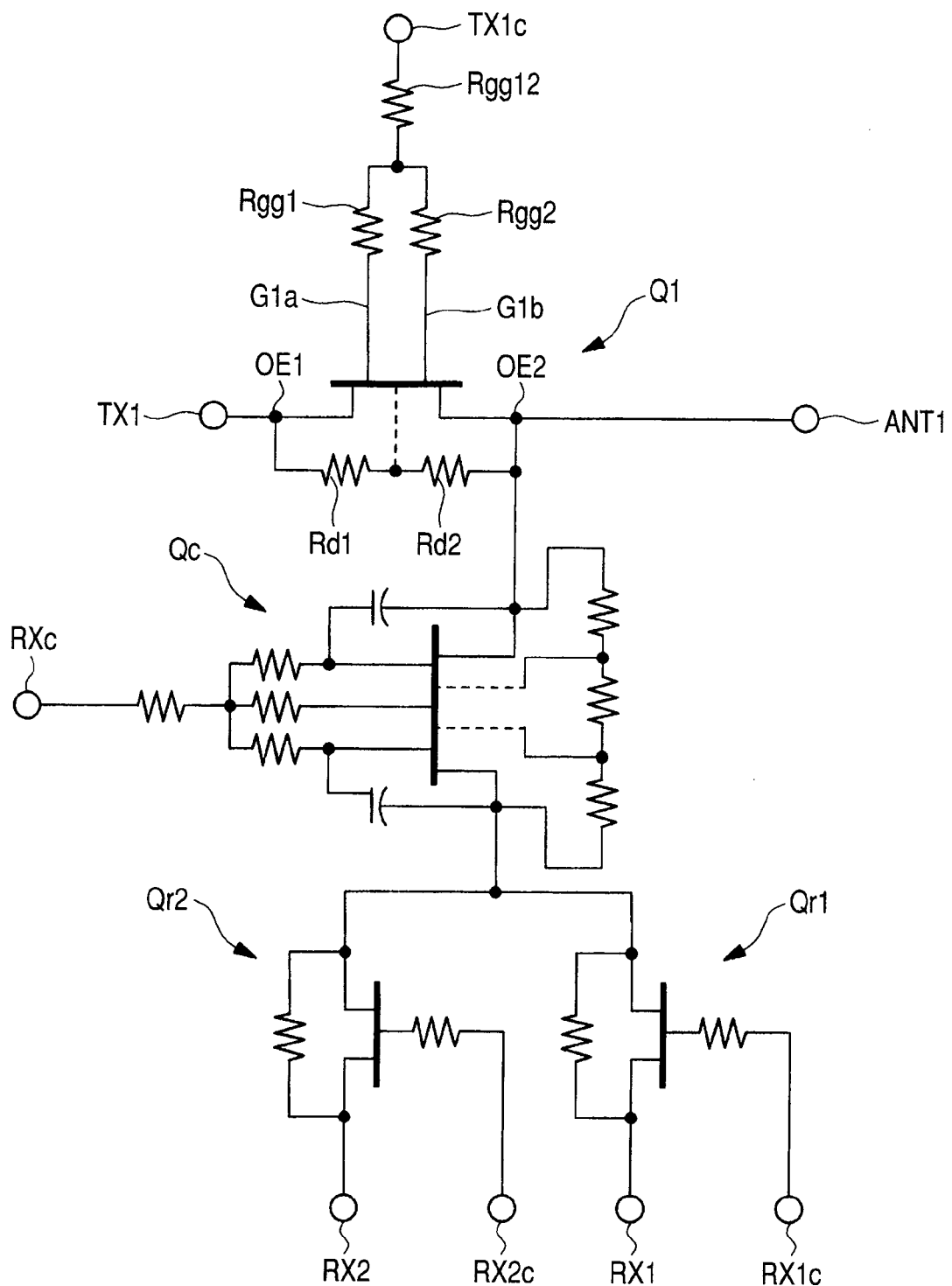
FIG. 9 is a diagram showing an example of a circuit configuring an antenna switch according to a second embodiment.

FIG. 9 is a diagram showing an example of the circuit configuration of an antenna switch. In FIG. 9, a transistor Q1 is coupled between an antenna terminal ANT1 and a transmission terminal TX1. The transistor Q1 has an ohmic electrode OE1 and an ohmic electrode OE2. The ohmic electrode OE1 is coupled to the transmission terminal TX1, and the ohmic electrode OE2 is coupled to the antenna terminal ANT1. The ohmic electrode OE1 and the ohmic electrode OE2 are coupled through a resistance Rd1 and a resistance Rd2. Further, the transistor Q1 has the dual gate structure and has two gate electrodes G1*a* and G1*b*. The gate electrode G1*a* is coupled to a gate terminal TX1*c* through a gate resistance Rgg1 and a gate resistance Rgg12. Similarly, the gate electrode G1*b* is coupled to the gate terminal TX1*c* through a gate resistance Rgg2 and the gate resistance Rgg12.

In the second embodiment, there are two reception terminals RX1 and RX2. A transistor Qc of a triple gate structure and a transistor Qr1 are coupled between the antenna terminal ANT1 and the reception terminal RX1. The gate electrode of the transistor Qc is coupled to a gate terminal RXc, and the gate electrode of the transistor Qr1 is coupled to a gate terminal RX1*c*. Similarly, the transistor Qc of the triple gate structure and a transistor Qr2 are coupled between the antenna terminal ANT1 and the reception terminal RX2. The gate electrode of the transistor Qc is coupled to the gate terminal RXc, and the gate electrode of the transistor Qr2 is coupled to a gate terminal RX2*c*. Since the multiple transistors are coupled between the antenna terminal ANT1 and the reception terminal RX1 or between the antenna terminal ANT1 and the reception terminal RX2, the off-capacitance of the transistor turned off at the time of transmission is divided so that the RF voltage applied to each off-capacitance decreases, thereby making it possible to suppress the occurrence of higher harmonics. The same reason applies to the adoption of the transistor Qc of the triple gate structure.

Figure 10:
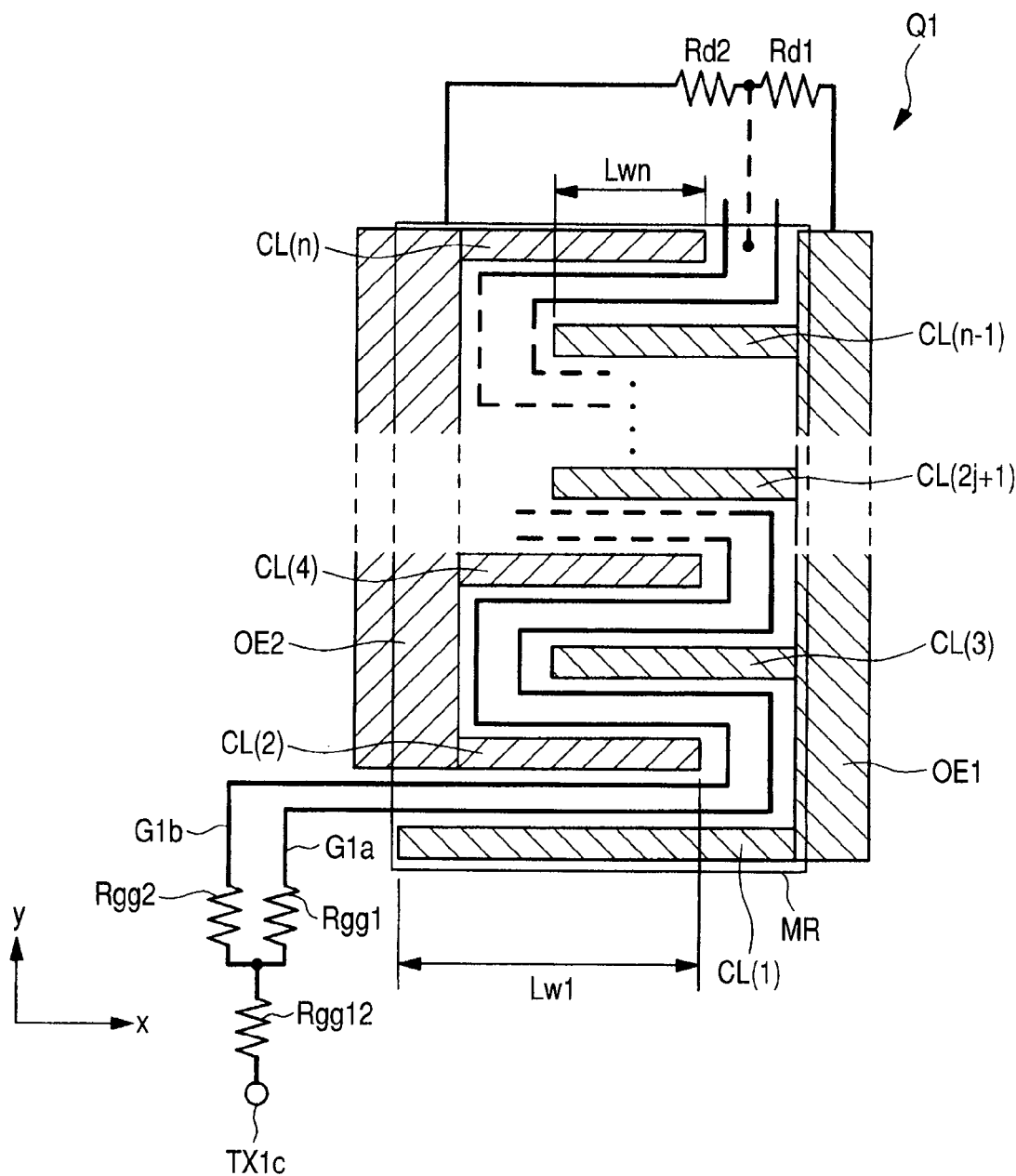
FIG. 10 is a diagram showing the layout configuration of a transistor according to the second embodiment.

The antenna switch according to the second embodiment is configured as described above, and an example in which the technical idea of the invention is applied to the transistor Q1 of the dual gate structure coupled between the antenna terminal ANT1 and the transmission terminal TX1 will be described below. FIG. 10 is a diagram showing the layout configuration of the transistor Q1 of the dual gate structure. As shown in FIG. 10, the transistor Q1 according to the second embodiment has the meander structure as in the transistor Q1 according to the first embodiment shown in FIG. 5. In the second embodiment, due to the dual gate structure, the two gate electrodes G1*a* and G1*b* in parallel are formed along the space formed between the comb-like electrodes CL(1), CL(3), ..., CL(2j+1) and the comb-like electrodes CL(2), CL(4), ..., CL(n). That is, the gate electrodes G1a and G1b extend meandering along the space formed between the comb-like electrodes CL(1), CL(3), ..., CL(2j+1) and the comb-like electrodes CL(2), CL(4), ..., CL(n).

In the second embodiment as well, the comb-like electrode CL(1) (finger length Lw1) is made longer than any other comb-like electrode CL(j) (finger length Lwj). The comb-like electrode CL(i) (finger length Lw1) mentioned above refers to the comb-like electrode that is closest to the input side of the gate electrodes G1a and G1b. That is, in FIG. 10, the gate electrode G1a extends from the gate terminal TX1c through the gate resistance Rgg12 and the gate resistance Rgg1 and the gate electrode G1b extends from the gate terminal TX1c through the gate resistance Rgg12 and the gate resistance Rgg2, and the comb-like electrode CL(1) (finger length Lw1) closest to the input side of the gate electrodes G1a and G1b coupled to the gate terminal TX1c, of the comb-like electrodes CL(j) (finger lengths Lwj) configuring the meander structure has the greatest length as in the first embodiment. With this configuration, it is possible to suppress the occurrence of higher harmonics maximally within the defined gate width as in the first embodiment. In the second embodiment, the example in which the technical idea of the invention is applied to the transistor Q1 of the dual gate structure has been described. However, the invention is not limited thereto, and the technical idea of the invention may be applied to, e.g., a transistor of the triple gate structure.

Third Embodiment

In the third embodiment, an example in which the length (finger length) of a comb-like electrode decreases with increasing distance from the input side where a control signal is inputted to the gate electrode in a transistor having the meander structure will be described.

Figure 11:
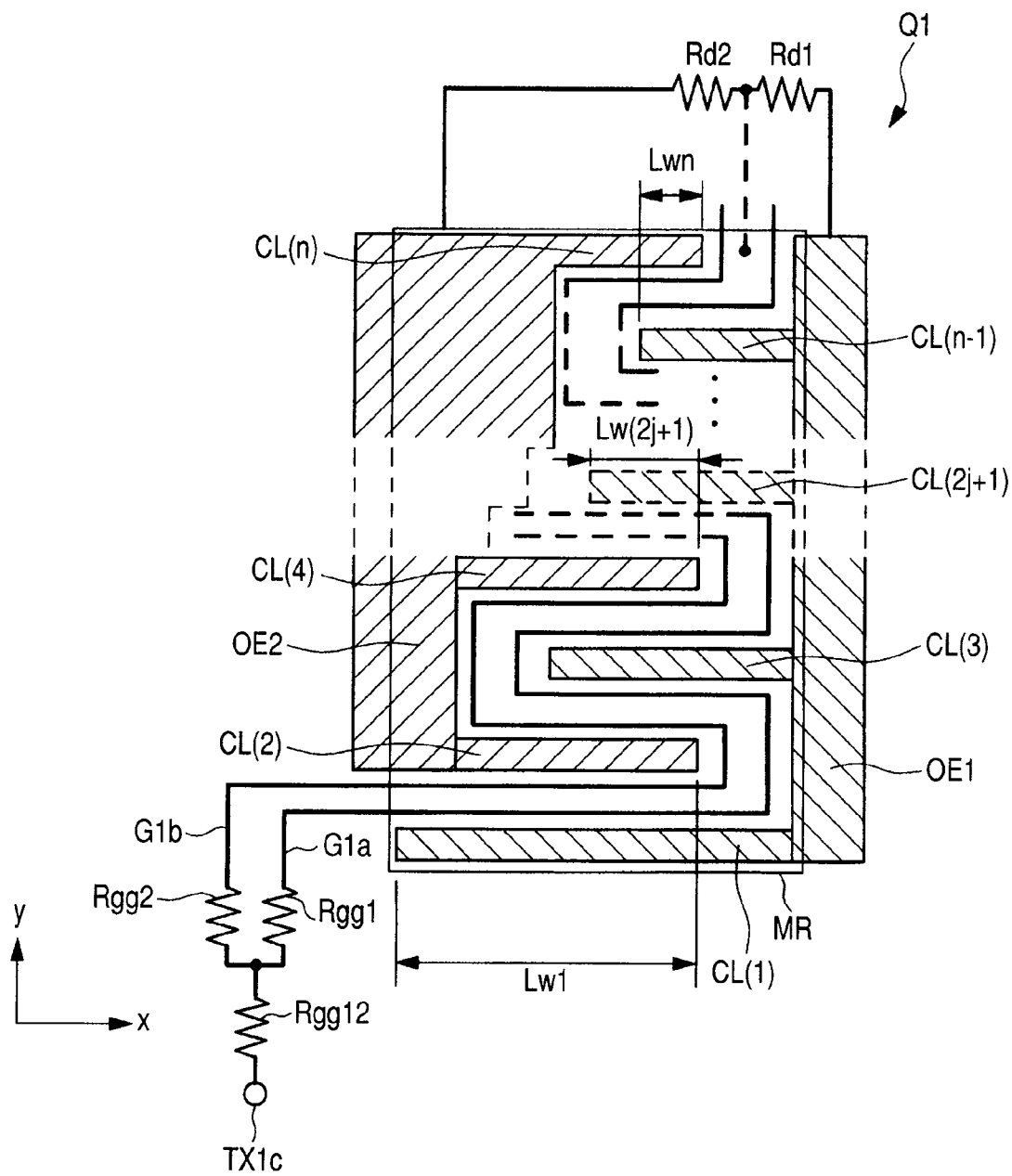
FIG. 11 is a diagram showing the layout configuration of a transistor according to a third embodiment.

FIG. 11 is a diagram showing the layout configuration of a transistor Q1 according to the third embodiment. As shown in FIG. 11, the transistor Q1 according to the third embodiment also has the dual gate structure and the meander structure as in the second embodiment. In FIG. 11, according to the characteristic of the transistor Q1 of the third embodiment, the lengths of the comb-like electrodes CL(1) to CL(n) gradually decrease. That is, there is established a relationship among the comb-like electrodes CL(1) to CL(n) in which the length of the comb-like electrode CL(1)>the length of the comb-like electrode CL(2)> ... >the length of the comb-like electrode CL(n). In other words, the comb-like electrodes CL(1) to CL(n) are formed to establish the relationship among the finger lengths Lw1 to Lwn in which the finger length Lw1>the finger length Lw2> ... >the finger length Lwn.

With this, in the third embodiment as well, the comb-like electrode CL(1) (finger length Lw1) of the partial transistor closest to the input side where the control signal is inputted to the gate electrode can have the greatest length, so that it is possible to suppress the occurrence of higher harmonics maximally within the defined gate width as in the first embodiment. That is, in the third embodiment, the gate width (finger length Lw1) of the partial transistor having the highest RF voltage (partial transistor closest to the gate input side) is increased, thereby decreasing the RF voltage applied across the partial transistor to suppress the occurrence of higher harmonics. Further, as the distance from the gate input side to a partial transistor increases, the RF voltage applied to the partial transistor decreases; accordingly, the finger length Lwj is gradually decreased. With this, it is possible to effectively suppress the occurrence of higher harmonics without greatly increasing the gate width of the whole of the partial transistors (the transistor Q1). That is, according to the third embodiment, it is possible to reduce the off-capacitance of the turned-off transistor Q1 and suppress the occurrence of higher harmonics from the turned-on transistor Q1.

Fourth Embodiment

While the example in which the HEMT (High Electron Mobility Transistor) is used as the transistor configuring the antenna switch has been described in the first embodiment, an example in which a MOSFET (Metal Oxide Semiconductor Field Effect Transistor) is used as a transistor configuring the antenna switch will be described in the fourth embodiment.

Figure 12:
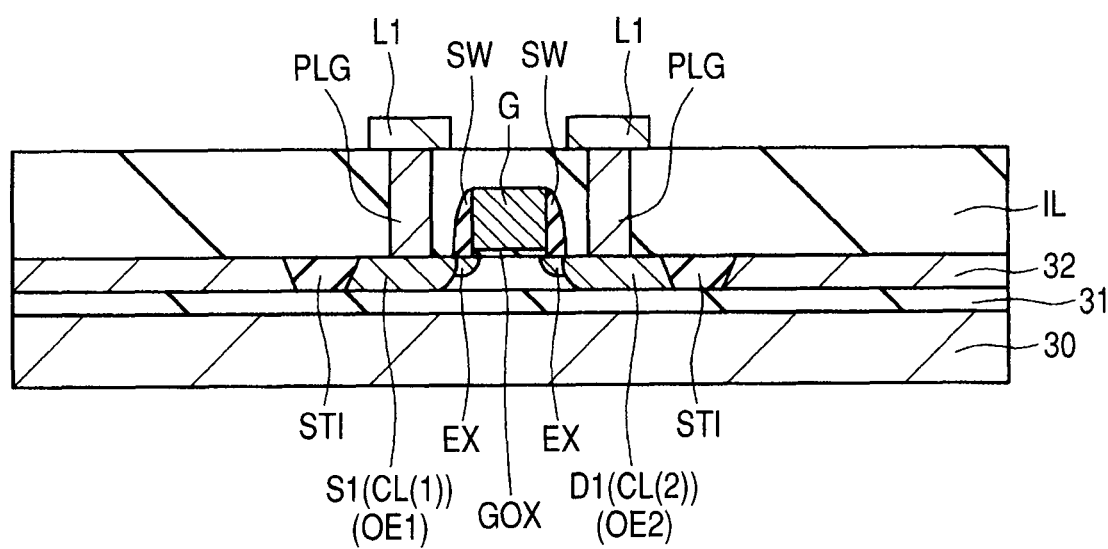
FIG. 12 is a cross sectional view showing the structure of a MOSFET according to a fourth embodiment.

FIG. 12 is a cross sectional view showing the structure of a MOSFET used as a transistor configuring the antenna switch. As shown in FIG. 12, a buried insulating layer 31 made of, e.g., a silicon oxide film is formed over a semiconductor substrate 30, and a silicon layer (active layer) 32 is formed over the buried insulating layer 31. That is, in the fourth embodiment, a MOSFET is formed over an SOI (Silicon on Insulator) substrate formed of the semiconductor substrate 30, the buried insulating layer 31, and the silicon layer 32. The MOSFET is formed in an active region divided by a shallow trench isolation region STI formed in the silicon layer 32. More specifically, the MOSFET has a gate insulating film GOX formed over the silicon layer 32 and has a gate electrode G over the gate insulating film GOX. The gate insulating film GOX is formed of, e.g., a silicon oxide film, and the gate electrode G is formed of, e.g., a laminated film formed of a polysilicon film and a silicide film.

Further, side walls SW made of, e.g., a silicon oxide film are formed on the opposite side walls of the gate electrode G. Matching the gate electrode G, extension regions EX which are impurity diffusion regions are formed in the silicon layer 32 directly under the side walls SW. Further, a source region S1 and a drain region D1 matching the side walls SW are formed outside the extension regions EX. The extension regions EX, the source region S1, and the drain region D1 are semiconductor regions into which n-type impurities such as phosphorus or arsenic are introduced. The amount of impurities introduced into the extension regions EX is smaller than the amount of impurities introduced into the source region S1 and the drain region D1.

The MOSFET according to the fourth embodiment is configured as described above, and an interlayer insulating film IL is formed over the MOSFET. Further, plugs PLG passing through the interlayer insulating film IL and reaching the source region S1 and the drain region D1 are formed. Lines L1 electrically coupled to the plugs PLG are formed over the interlayer insulating film IL.

In the fourth embodiment, the MOSFET is formed over the SOI substrate, which enables complete shallow trench isolation and can reduce the capacitance of the source region S1 or the drain region D1. This brings about an advantage of enhancing integration density, operating speed, high breakdown voltage, and latch-up free.

The above-described MOSFET functions as the transistor configuring the antenna switch, and the planar structure thereof indicates the meander structure as in the first embodiment (see FIG. 5). Accordingly, the source region S1 shown in FIG. 12 configures, for example, the comb-like electrode CL(1), and the drain region D1 configures the comb-like electrode CL(2). The comb-like electrode CL(1) is coupled to the ohmic electrode OE1, and the comb-like electrode CL(2) is coupled to the ohmic electrode OE2.

In the meander structure using the MOSFET as well, the comb-like electrode CL(1) (finger length Lw1) is made longer than any other comb-like electrode CL(j) (finger length Lwj) as shown in FIG. 5. The comb-like electrode CL(1) (finger length Lw1) mentioned above refers to the comb-like electrode that is closest to the input side of the gate electrode G1. That is, in FIG. 5, the gate electrode G1 extends from the gate terminal TX1c through the gate resistance Rgg1, and the comb-like electrode CL(1) (finger length Lw1) closest to the input side of the gate electrode G1 coupled to the gate terminal TX1c, of the comb-like electrodes CL(j) (finger lengths Lwj) configuring the meander structure has the greatest length as in the first embodiment. With this configuration, it is possible to suppress the occurrence of higher harmonics maximally within the defined gate width as in the first embodiment.

Figure 13:
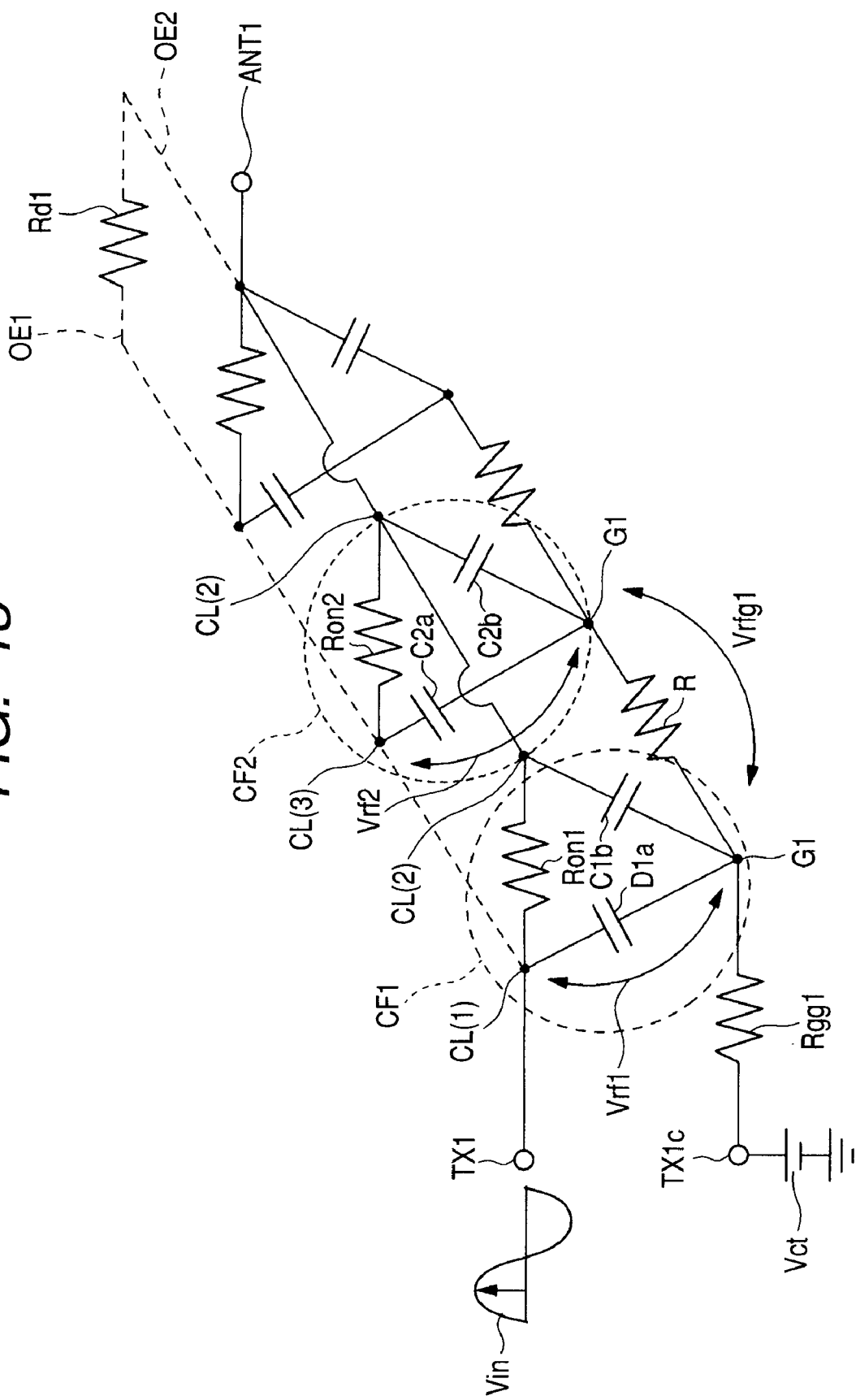
FIG. 13 is an equivalent circuit diagram of one turned-on transistor (MOSFET) with the meander structure, according to the fourth embodiment.

The invention is also effective in the meander structure using the MOSFET, which will be described below. FIG. 13 is an equivalent circuit diagram of one turned-on transistor with the meander structure. The configuration shown in FIG. 13 is approximately similar to that of FIG. 7. FIG. 13 differs from FIG. 7 in the following points. In the partial transistor CF1, a capacitance C1a is coupled between the gate electrode G1 and the comb-like electrode CL(1), and a capacitance C1b is coupled between the gate electrode G1 and the comb-like electrode CL(2). Similarly, in the partial transistor CF2, a capacitance C2a is coupled between the gate electrode G1 and the comb-like electrode CL(3), and a capacitance C2b is coupled between the gate electrode G1 and the comb-like electrode CL(2). Therefore, there is a difference between FIG. 7 and FIG. 13 in that a Schottky barrier diode or a capacitance is coupled between the gate electrode G1 and the comb-like electrode CL(1) in the partial transistor CF1 for example. This is because the HEMT is used as the transistor in the first embodiment shown in FIG. 7 whereas the MOSFET is used as the transistor in the fourth embodiment shown in FIG. 13. That is, in the case of the HEMT, the gate electrode G and the substrate form the Schottky barrier, whereas, in the case of the MOSFET, the gate electrode G and the substrate form the capacitance in which the gate insulating film GOX is the capacitance insulating film.

In FIG. 13, for example, in the partial transistor CF1, an RF voltage Vrf1 is applied across the capacitance C1a. When the RF voltage Vrf1 is applied across the capacitance C1a, higher harmonics occur. The higher harmonics which occur from the capacitance C1a increase as the RF voltage Vrf1 applied across the capacitance C1a increases. Therefore, in the fourth embodiment as well, if it is possible to decrease the RF voltage Vrf1 which occurs across the capacitance C1a, it is possible to suppress the occurrence of higher harmonics.

Hereinafter, consideration will be given to the magnitude relation among the RF voltages Vrf1, Vrf2, . . . , Vrfj applied across the capacitances C1a, C2a, . . . , Cja configuring the partial transistors CF1, CF2, . . . , CFj respectively. As shown in FIG. 13, the RF voltage Vrf1 applied across the capacitance C1a in the partial transistor CF1 is determined by the impedance ratio between the gate resistance Rgg1 and the capacitance C1a. On the other hand, the RF voltage Vrf2 applied across the capacitance C2a in the partial transistor CF2 is determined by the impedance ratio among the gate resistance Rgg1, the resistance R, and the capacitance C2a. Therefore, the RF voltage Vrf1 applied across the capacitance C1a configuring the partial transistor CF1 is larger than the RF voltage Vrf2 applied across the capacitance C2a configuring the partial transistor CF2. That is, in the partial transistor CF2, since the resistance R exists due to gate wiring, the RF voltage Vrf2 applied across the capacitance C2a configuring the partial transistor CF2 is inevitably smaller than the RF voltage Vrf1 applied across the capacitance C1a configuring the partial transistor CF1 by an RF voltage Vrfg1 applied across the resistance R. Similarly, the RF voltages Vrf1, Vrf2, . . . , Vrfj applied across the capacitances C1a, C2a, . . . , Cja decrease with proceeding partial transistors from CF1 to CFj. That is, the RF voltage Vrf1 is the highest. Since the occurrence of higher harmonics increases as the RF voltage increases, the partial transistor CF1 causes the largest occurrence of higher harmonics.

From this fact, in the fourth embodiment as well, if it is possible to suppress higher harmonics that occur from the partial transistor CF1 closest to the gate terminal TX1c (in other words, the gate input side), it is possible to sufficiently suppress the occurrence of higher harmonics from the transistor Q1. In the partial transistor CF1, the RF voltage applied across the capacitance C1a can be decreased by decreasing the impedance of the capacitance C1a. The impedance of the capacitance C1a can be decreased by increasing the gate width of the partial transistor CF1. Therefore, the technical idea of the invention is also effective in the meander structure using the MOSFET as in the fourth embodiment.

While the example in which the MISFET is formed over the SOI substrate has been described in the fourth embodiment, the invention is also applicable to such a case where the MOSFET is formed over an SOS (Silicon on Sapphire) substrate instead of the SOI substrate.

While the invention made above by the present inventors has been described specifically based on the illustrated embodiments, the present invention is not limited thereto. It is needless to say that various changes and modifications can be made thereto without departing from the spirit and scope of the invention.

In the above embodiments, the examples in which the technical idea of the invention is applied to the transistor turned on at the time of transmission have been described. However, the invention is not limited thereto, and the technical idea of the invention can also be applied to, e.g., a transistor turned on at the time of reception (in other words, turned off at the time of transmission).

The present invention can widely be used in the manufacturing industry that manufactures semiconductor devices.

What is claimed is:

1. A semiconductor device comprising a field effect transistor formed over a semiconductor substrate, the field effect transistor having:

(a) a first ohmic electrode and a second ohmic electrode which extend in a first direction of the semiconductor substrate and are disposed to face each other;

(b) a plurality of first comb-like electrodes which project in a second direction intersecting the first direction from a counter surface, facing the second ohmic electrode, of the first ohmic electrode;

(c) a plurality of second comb-like electrodes which project in the second direction intersecting the first direction from the counter surface, facing the first ohmic electrode, of the second ohmic electrode; and (d) a gate electrode which extends along a space formed between the first comb-like electrodes and the second comb-like electrodes by disposing the first comb-like electrodes and the second comb-like electrodes alternately in comb shape, wherein a length of a comb-like electrode closest to an input side where a control signal is inputted to the gate electrode, of comb-like electrodes including the first comb-like electrodes and the second comb-like electrodes is made greater than the lengths of the other comb-like electrodes.

2. The semiconductor device according to claim 1, wherein the comb-like electrode closest to the input side where the control signal is inputted to the gate electrode has the greatest length in all the comb-like electrodes.

3. A semiconductor device comprising an antenna switch which switches between transmission of a transmission signal and reception of a reception signal over a semiconductor substrate, the antenna switch having:
(a) a first terminal to which the transmission signal is inputted;
(b) a second terminal coupled to an antenna;
(c) a third terminal from which the reception signal is outputted;
(d) a first switching element coupled between the first terminal and the second terminal; and
(e) a second switching element coupled between the second terminal and the third terminal,
wherein the first switching element is activated and the second switching element is deactivated at the time of transmitting the transmission signal, whereas the first switching element is deactivated and the second switching element is activated at the time of receiving the reception signal,
the first switching element being comprised of a field effect transistor,
the field effect transistor having:
(f1) a first ohmic electrode and a second ohmic electrode which extend in a first direction of the semiconductor substrate and are disposed to face each other;
(f2) a plurality of first comb-like electrodes which project in a second direction intersecting the first direction from a counter surface, facing the second ohmic electrode, of the first ohmic electrode;
(f3) a plurality of second comb-like electrodes which project in the second direction intersecting the first direction from the counter surface, facing the first ohmic electrode, of the second ohmic electrode; and
(f4) a gate electrode which extends along a space formed between the first comb-like electrodes and the second comb-like electrodes by disposing the first comb-like electrodes and the second comb-like electrodes alternately in comb shape,
wherein a length of a comb-like electrode closest to an input side where a control signal is inputted to the gate electrode, of comb-like electrodes including the first comb-like electrodes and the second comb-like electrodes is made greater than the lengths of the other comb-like electrodes.

4. The semiconductor device according to claim 3, wherein the comb-like electrode closest to the input side where the control signal is inputted to the gate electrode has the greatest length in all the comb-like electrodes.

5. A semiconductor device comprising:
(a) a first amplifier which amplifies a transmission signal; and
(b) an antenna switch which performs a switching operation to transmit the transmission signal amplified by the first amplifier from an antenna at the time of transmitting the transmission signal and performs a switching operation to output a reception signal received by the antenna to a reception circuit at the time of receiving the reception signal, the antenna switch having:
(b1) a first terminal to which the transmission signal is inputted;
(b2) a second terminal coupled to an antenna;
(b3) a third terminal from which the reception signal is outputted;
(b4) a first switching element coupled between the first terminal and the second terminal; and
(b5) a second switching element coupled between the second terminal and the third terminal,
wherein the first switching element is activated and the second switching element is deactivated at the time of transmitting the transmission signal, whereas the first switching element is deactivated and the second switching element is activated at the time of receiving the reception signal,
the first switching element being comprised of a field effect transistor,
the field effect transistor having:
(c1) a first ohmic electrode and a second ohmic electrode which extend in a first direction of the semiconductor substrate and are disposed to face each other;
(c2) a plurality of first comb-like electrodes which project in a second direction intersecting the first direction from a counter surface, facing the second ohmic electrode, of the first ohmic electrode;
(c3) a plurality of second comb-like electrodes which project in the second direction intersecting the first direction from the counter surface, facing the first ohmic electrode, of the second ohmic electrode; and
(c4) a gate electrode which extends along a space formed between the first comb-like electrodes and the second comb-like electrodes by disposing the first comb-like electrodes and the second comb-like electrodes alternately in comb shape,
wherein a length of a comb-like electrode closest to an input side where a control signal is inputted to the gate electrode, of comb-like electrodes including the first comb-like electrodes and the second comb-like electrodes, is made greater than the lengths of the other comb-like electrodes.

6. The semiconductor device according to claim 1, wherein a plurality of gate electrodes in parallel extend along a space formed between the first comb-like electrodes and the second comb-like electrodes.

7. The semiconductor device according to claim 1, wherein the first comb-like electrodes have mutually different lengths, and the second comb-like electrodes also have mutually different lengths.

8. The semiconductor device according to claim 7, wherein the lengths of the comb-like electrodes including the first comb-like electrodes and the second comb-like electrodes decrease with increasing distance from the input side where the control signal is inputted to the gate electrode.

9. The semiconductor device according to claim 1, wherein the field effect transistor is a high electron mobility transistor.

10. The semiconductor device according to claim 9, wherein a semiconductor layer is formed between the gate electrode and the semiconductor substrate, and a Schottky barrier is formed at the boundary between the gate electrode and the semiconductor layer.

11. The semiconductor device according to claim 10, wherein the semiconductor substrate is formed of a compound semiconductor.

12. The semiconductor device according to claim 1, wherein a gate insulating film is formed between the gate electrode and the semiconductor substrate.

13. The semiconductor device according to claim 12, wherein the semiconductor substrate is an SOI substrate or an SOS substrate.

14. The semiconductor device according to claim 3, wherein the second switching element is also comprised of the field effect transistor having the same configuration as that of the first switching element.

15. The semiconductor device according to claim 3, wherein a plurality of gate electrodes in parallel extend along a space formed between the first comb-like electrodes and the second comb-like electrodes.

16. The semiconductor device according to claim 3, wherein the first comb-like electrodes have mutually different lengths, and the second comb-like electrodes also have mutually different lengths.

17. The semiconductor device according to claim 16, wherein the lengths of the comb-like electrodes including the first comb-like electrodes and the second comb-like electrodes decrease with increasing distance from the input side where the control signal is inputted to the gate electrode.

18. The semiconductor device according to claim 5, wherein the semiconductor device configures an RF module of a cellular phone.

* * * * *